United States Patent
Yoshimura et al.

(10) Patent No.: US 10,381,529 B2
(45) Date of Patent: Aug. 13, 2019

(54) LIGHT-EMITTING DEVICE AND DISPLAY DEVICE

(71) Applicants: Sharp Kabushiki Kaisha, Sakai, Osaka (JP); National Institute for Materials Science, Tsukuba-shi, Ibaraki (JP)

(72) Inventors: Kenichi Yoshimura, Sakai (JP); Makoto Izumi, Sakai (JP); Hiroshi Fukunaga, Sakai (JP); Naoto Hirosaki, Tsukuba (JP)

(73) Assignees: SHARP KABUSHIKI KAISHA, Sakai (JP); NATIONAL INSTITUTE FOR MATERIALS SCIENCE, Ibaraki (JP)

(*) Notice: Subject to any disclaimer, the term of this patent is extended or adjusted under 35 U.S.C. 154(b) by 274 days.

(21) Appl. No.: 15/447,225

(22) Filed: Mar. 2, 2017

(65) Prior Publication Data

US 2017/0279012 A1 Sep. 28, 2017

(30) Foreign Application Priority Data

Mar. 28, 2016 (JP) ................. 2016-064697

(51) Int. Cl.
- H01L 33/50 (2010.01)
- C09K 11/08 (2006.01)
- C09K 11/61 (2006.01)
- C09K 11/64 (2006.01)
- H01L 27/15 (2006.01)

(52) U.S. Cl.
CPC ........ *H01L 33/504* (2013.01); *C09K 11/0883* (2013.01); *C09K 11/617* (2013.01); *C09K 11/641* (2013.01); *H01L 27/156* (2013.01)

(58) Field of Classification Search
CPC ............. H01L 33/504; G02F 1/133614; C09K 11/676; C09K 11/675; C09K 11/0883
See application file for complete search history.

(56) References Cited

U.S. PATENT DOCUMENTS

| | | | |
|---|---|---|---|
| 6,696,704 B1 | 2/2004 | Maeda et al. | |
| 7,497,973 B2 * | 3/2009 | Radkov | C09K 11/617 252/301.4 H |
| 2007/0114514 A1 | 5/2007 | Ito | |
| 2009/0121608 A1 | 5/2009 | Xie et al. | |
| 2010/0091215 A1 * | 4/2010 | Fukunaga | C09K 11/664 349/61 |

(Continued)

FOREIGN PATENT DOCUMENTS

| | | |
|---|---|---|
| JP | 2000-208822 A | 7/2000 |
| JP | 2007-142289 A | 6/2007 |

(Continued)

OTHER PUBLICATIONS

Translation for JP 2009-218422, Sep. 24, 2009.*

(Continued)

*Primary Examiner* — C Melissa Koslow
(74) *Attorney, Agent, or Firm* — Keating & Bennett, LLP

(57) ABSTRACT

A light-emitting device includes a light-emitting element that emits blue light, a $Mn^{2+}$-activated γ-AlON green phosphor, and a dispersing material in which the green phosphor is dispersed. The green phosphor has an in-crystal Mn concentration of 2.5 wt % or more. The shortest path of the blue light through the dispersing material is 1 mm long or shorter.

11 Claims, 14 Drawing Sheets

| | GREEN PHOSPHOR PRODUCTION EXAMPLE | GREEN PHOSPHOR/DISPERSING MATERIAL WEIGHT RATIO | TLLE (lm/W) | DEVICE LUMINOUS FLUX (RELATIVE VALUE) | DEVICE MASS-PRODUCTION SUITABILITY | CHROMATICITY COORDINATES OF DEVICE EMISSION SPECTRUM | |
|---|---|---|---|---|---|---|---|
| | | | | | | CIEx | CIEy |
| COMPARATIVE EXAMPLE DG0 | COMPARATIVE PRODUCTION EXAMPLE P0 | 1.33 | 165 | 106 | UNACCEPTABLE | 0.167 | 0.150 |
| EXAMPLE DG1 | PRODUCTION EXAMPLE P1 | 0.89 | 166 | 130 | GOOD | 0.171 | 0.150 |
| EXAMPLE DG2 | PRODUCTION EXAMPLE P2 | 0.85 | 167 | 121 | GOOD | 0.176 | 0.150 |
| EXAMPLE DG3 | PRODUCTION EXAMPLE P3 | 1.05 | 169 | 100 | GOOD | 0.180 | 0.151 |
| EXAMPLE DG4 | PRODUCTION EXAMPLE P4 | 1.13 | 168 | 91 | ACCEPTABLE | 0.187 | 0.150 |
| EXAMPLE DG5 | PRODUCTION EXAMPLE P5 | 1.14 | 166 | 145 | ACCEPTABLE | 0.171 | 0.150 |
| EXAMPLE DG6 | PRODUCTION EXAMPLE P6 | 0.52 | 166 | 91 | GOOD | 0.171 | 0.150 |

(56) References Cited

U.S. PATENT DOCUMENTS

| | | |
|---|---|---|
| 2011/0043101 A1 | 2/2011 | Masuda et al. |
| 2011/0182072 A1 | 7/2011 | Shimizu et al. |
| 2014/0124802 A1* | 5/2014 | Do ..................... H01L 25/0753 257/89 |
| 2016/0276549 A1 | 9/2016 | Yamashita et al. |

FOREIGN PATENT DOCUMENTS

| | | | |
|---|---|---|---|
| JP | 2007-308605 A | | 11/2007 |
| JP | 2008-135707 A | | 6/2008 |
| JP | 2009-065145 A | | 3/2009 |
| JP | 2009-096854 | * | 5/2009 |
| JP | 2009-096854 A | | 5/2009 |
| JP | 2009-218422 | * | 9/2009 |
| JP | 2009-218422 A | | 9/2009 |
| JP | 2010-093132 A | | 4/2010 |
| JP | 2013-145921 A | | 7/2013 |
| WO | 2007/099862 A1 | | 9/2007 |
| WO | 2009/110285 A1 | | 9/2009 |
| WO | 2015/068513 A1 | | 5/2015 |

OTHER PUBLICATIONS

Translation for JP 2009-96854, May 7, 2009.*
Yoshimura et al, "Achieving super wide-color-gamut disply by using narrow-band green-emitting gamma-AlON:Mn,Mg phosphor", Jap. Joun. App. Phy., vol. 56, #4, 041701, pp. 1-5, Feb. 24, 2017.*
Partial translation for Yoshimura et al, "The white LED with gamma-AlON:Mn,Mg phoshor for the wide-color gamut display", Jun. 3, 2016.*
Xie et al., "Crystal structure and photoluminescence of Mn 2 + – Mg 2 + codoped gamma aluminum oxynitride (– Al O N) : A promising green phosphor for white light-emitting diodes", Applied Physics Letters, vol. 92, 2008, 4 pages, pp. 201905-1 to 201905-3.
Yoshimura et al., "White LED using narrow-band γ-AlON:Mn, Mg green phosphor for super wide-color gamut display", The 23rd International Display Workshop, Late-News Paper, PH1-4L, Dec. 7, 2016, pp. 585-586.
Sharp, "Specifications Surface Mount LED GM5Fxxxx10A", http://www.sharp-world.com/products/device/, Sharp LED-E14-1-15-A, Jul. 24, 2015, 21 pages.
Xie et al., "Gamma-AlON:Mn2+: An interesting narrow band green phosphor for white LED backlights", Proceedings of International Symposium on Phosphor Materials 2015 in Niigata; Jul. 29, 2015; p. 92.
Yoshimura et al., "The white LED with γ-AlON:Mn, Mg for wide-color gamut display", The 363rd Phosphor Research Society Meeting Technical Digest; Jun. 3, 2016, pp. 29-34.
Yoshimura et al., "The white LED with γ-AlON:Mn2+, Mg2+ phosphor and K2SiF6:Mn4+ phosphor for the wide-color gamut display", Extended Abstracts of The 63rd Japan Society of Applied Physics (JSAP) Spring Meeting 2016, Tokyo Institute of Technology; Ookayama Campus, Mar. 21, 2016, p. 11-413.
Yoshimura et al., "Achieving super wide-color-gamut display by using narrow-band green-emitting γ-AlON:Mn,Mg phosphor", Japanese Journal of Applied Physics,vol. 56, No. 4; Feb. 24, 2017, 23 pages.

* cited by examiner

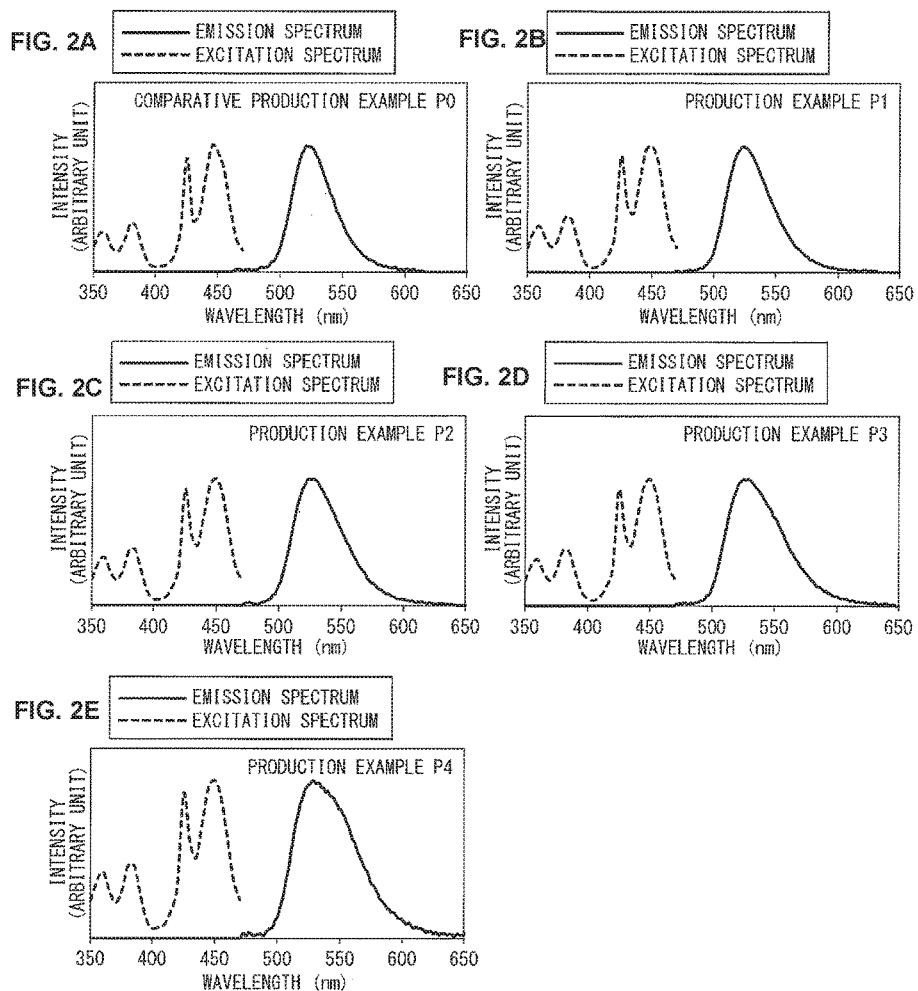

FIG. 3

| | PROPORTIONS OF RAW MATERIAL POWDERS | | | | EMISSION SPECTRUM WIDTH AT HALF MAXIMUM (nm) | EMISSION SPECTRUM PEAK WAVELENGTH (nm) | CHROMATICITY COORDINATES OF PHOSPHOR EMISSION SPECTRUM | | IN-CRYSTAL Mn CONCENTRATION (% BY WEIGHT) | AVERAGE PARTICLE DIAMETER (μm) |
|---|---|---|---|---|---|---|---|---|---|---|
| | AlN | Al$_2$O$_3$ | MgO | MnF$_2$ | | | CIEx | CIEy | | |
| COMPARATIVE PRODUCTION EXAMPLE P0 | 10.7 | 79.86 | 4.68 | 4.76 | 38 | 522 | 0.204 | 0.721 | 2.4 | 13.5 |
| PRODUCTION EXAMPLE P1 | 10.41 | 77.64 | 4.55 | 7.41 | 42 | 524 | 0.223 | 0.716 | 3.02 | 13.1 |
| PRODUCTION EXAMPLE P2 | 10.31 | 76.93 | 4.5 | 8.26 | 46 | 528 | 0.242 | 0.703 | 3.45 | 13.4 |
| PRODUCTION EXAMPLE P3 | 10.22 | 76.23 | 4.46 | 9.09 | 51 | 525 | 0.262 | 0.690 | 4.56 | 12.7 |
| PRODUCTION EXAMPLE P4 | 9.86 | 73.55 | 4.31 | 12.28 | 58 | 529 | 0.300 | 0.662 | 4.7 | 12.2 |
| PRODUCTION EXAMPLE P5 | 10.41 | 77.64 | 4.55 | 7.41 | 42 | 524 | 0.223 | 0.716 | 3.02 | 25.1 |
| PRODUCTION EXAMPLE P6 | 10.41 | 77.64 | 4.55 | 7.41 | 42 | 524 | 0.223 | 0.716 | 3.02 | 7.6 |

FIG. 5

| GREEN PHOSPHOR | GREEN PHOSPHOR PRODUCTION EXAMPLE | GREEN PHOSPHOR/DISPERSING MATERIAL WEIGHT RATIO | TLLE (lm/W) | DEVICE LUMINOUS FLUX (RELATIVE VALUE) | DEVICE MASS-PRODUCTION SUITABILITY | CHROMATICITY COORDINATES OF DEVICE EMISSION SPECTRUM | |
|---|---|---|---|---|---|---|---|
| | | | | | | CIEx | CIEy |
| COMPARATIVE EXAMPLE DG0 | COMPARATIVE PRODUCTION EXAMPLE P0 | 1.33 | 165 | 106 | UNACCEPTABLE | 0.167 | 0.150 |
| EXAMPLE DG1 | PRODUCTION EXAMPLE P1 | 0.89 | 166 | 130 | GOOD | 0.171 | 0.150 |
| EXAMPLE DG2 | PRODUCTION EXAMPLE P2 | 0.85 | 167 | 121 | GOOD | 0.176 | 0.150 |
| EXAMPLE DG3 | PRODUCTION EXAMPLE P3 | 1.05 | 169 | 100 | GOOD | 0.180 | 0.151 |
| EXAMPLE DG4 | PRODUCTION EXAMPLE P4 | 1.13 | 168 | 91 | ACCEPTABLE | 0.187 | 0.150 |
| EXAMPLE DG5 | PRODUCTION EXAMPLE P5 | 1.14 | 166 | 145 | ACCEPTABLE | 0.171 | 0.150 |
| EXAMPLE DG6 | PRODUCTION EXAMPLE P6 | 0.52 | 166 | 91 | GOOD | 0.171 | 0.150 |

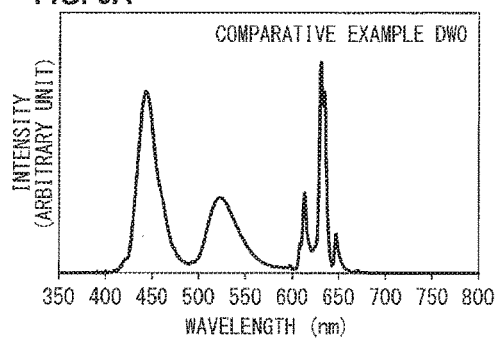
FIG. 9A COMPARATIVE EXAMPLE DW0
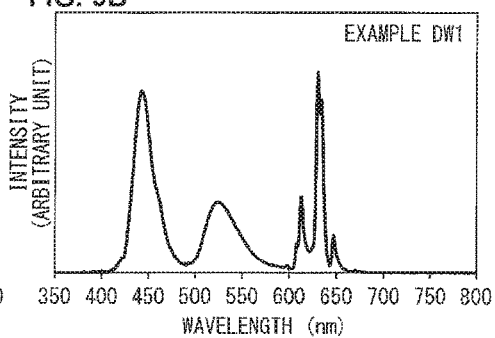
FIG. 9B EXAMPLE DW1
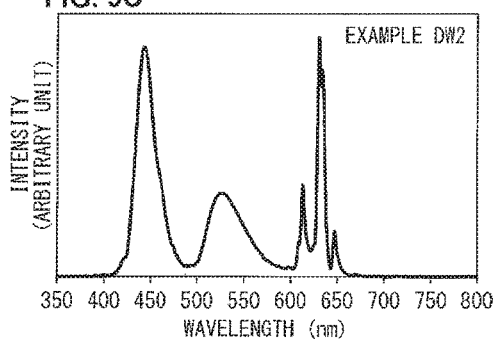
FIG. 9C EXAMPLE DW2
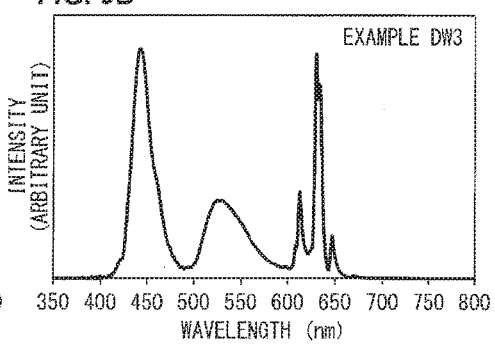
FIG. 9D EXAMPLE DW3
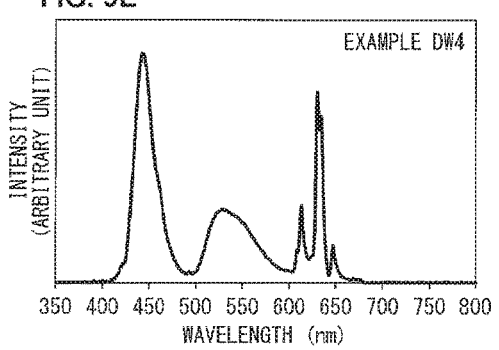
FIG. 9E EXAMPLE DW4

FIG. 10

| GREEN PHOSPHOR PRODUCTION EXAMPLE | | GREEN PHOSPHOR/RED PHOSPHOR WEIGHT RATIO | PHOSPHORS/DISPERSING MATERIAL WEIGHT RATIO | DEVICE LUMINOUS FLUX (RELATIVE VALUE) | DEVICE MASS-PRODUCTION SUITABILITY | CHROMATICITY COORDINATES OF WHITE POINT THROUGH LIQUID CRYSTAL PANEL | |
|---|---|---|---|---|---|---|---|
| | | | | | | CIEx | CIEy |
| COMPARATIVE EXAMPLE DW0 | COMPARATIVE PRODUCTION EXAMPLE P0 | 19.9 | 1.42 | 111 | UNACCEPTABLE | 0.280 | 0.288 |
| EXAMPLE DW1 | PRODUCTION EXAMPLE P1 | 16.0 | 0.94 | 138 | GOOD | 0.281 | 0.288 |
| EXAMPLE DW2 | PRODUCTION EXAMPLE P2 | 18.9 | 0.87 | 129 | GOOD | 0.280 | 0.288 |
| EXAMPLE DW3 | PRODUCTION EXAMPLE P3 | 18.2 | 1.08 | 100 | GOOD | 0.281 | 0.288 |
| EXAMPLE DW4 | PRODUCTION EXAMPLE P4 | 20.4 | 1.18 | 92 | ACCEPTABLE | 0.281 | 0.288 |
| EXAMPLE DW5 | PRODUCTION EXAMPLE P5 | 16.5 | 1.19 | 149 | ACCEPTABLE | 0.281 | 0.288 |
| EXAMPLE DW6 | PRODUCTION EXAMPLE P6 | 14.0 | 0.52 | 91 | GOOD | 0.281 | 0.288 |

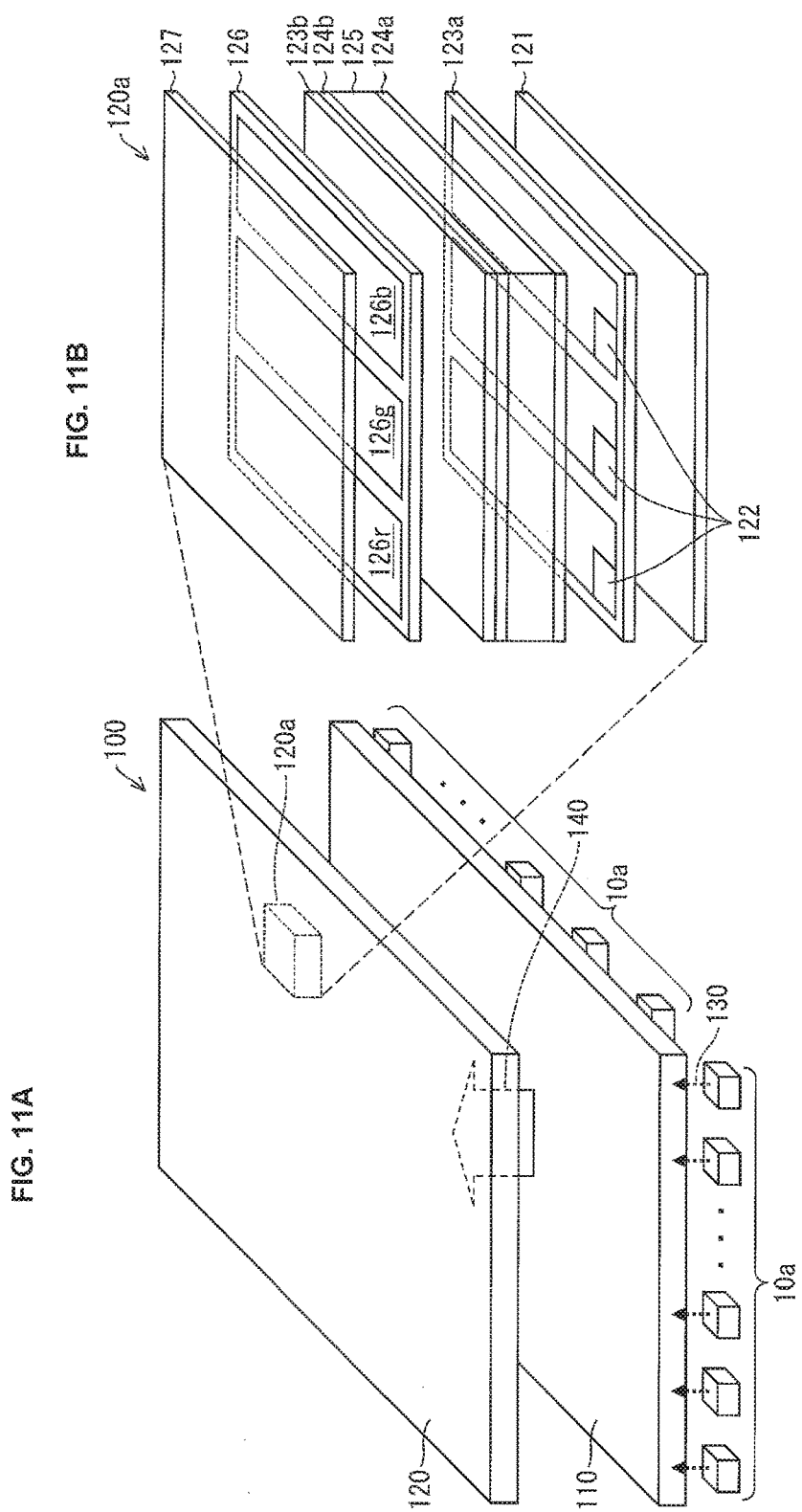

FIG. 13

| EXAMPLE | LIGHT-EMITTING DEVICE | COLOR GAMUT | | | | RED POINT | | GREEN POINT | | BLUE POINT | |
|---|---|---|---|---|---|---|---|---|---|---|---|
| | | NTSC COVERAGE | NTSC PERCENT AREA | ADOBE RGB COVERAGE | ADOBE RGB PERCENT AREA | x | y | x | y | x | y |
| EXAMPLE DIS1 | EXAMPLE DW1 | 93.5% | 100.3% | 98.6% | 105.0% | 0.677 | 0.299 | 0.214 | 0.707 | 0.151 | 0.077 |
| EXAMPLE DIS2 | EXAMPLE DW2 | 90.9% | 98.1% | 95.5% | 102.7% | 0.675 | 0.300 | 0.228 | 0.700 | 0.152 | 0.073 |
| EXAMPLE DIS3 | EXAMPLE DW3 | 88.0% | 95.3% | 92.4% | 99.8% | 0.672 | 0.302 | 0.242 | 0.691 | 0.152 | 0.070 |

FIG. 14

| | GREEN PHOSPHOR PRODUCTION EXAMPLE | ELEMENT PEAK WAVELENGTH (nm) | GREEN PHOSPHOR/RED PHOSPHOR WEIGHT RATIO | PHOSPHORS/DISPERSING MATERIAL WEIGHT RATIO | DEVICE LUMINOUS FLUX (RELATIVE VALUE) |
|---|---|---|---|---|---|
| EXAMPLE DW1 (EMBODIMENT 2) | PRODUCTION EXAMPLE P1 | 445 | 16.0 | 0.94 | 124 |
| EXAMPLE DW7 (EMBODIMENT 4) | PRODUCTION EXAMPLE P1 | 460 | 14.1 | 1.11 | 108 |
| EXAMPLE DW8 (EMBODIMENT 5) | PRODUCTION EXAMPLE P1 | 440 | 18.0 | 0.95 | 118 |

LIGHT-EMITTING DEVICE AND DISPLAY DEVICE

BACKGROUND

1. Field

The present disclosure relates to a light-emitting device and a display device.

2. Description of the Related Art

Recent years have seen the development of light-emitting devices that have (i) a light-emitting element such as a light-emitting diode (LED) combined with (ii) a wavelength-converting member that transforms excitation light from the light-emitting element into fluorescence (e.g., particles of a phosphor dispersed in resin). Advantageously compact and consuming less power than incandescent lamps, light-emitting devices of this type are in practical use as light sources for various display devices and illumination devices.

A commonly used light-emitting device of this type is a combination of a blue LED and a yellow phosphor. The yellow phosphor is typically Ce-activated YAG (yttrium aluminum garnet) because of its high luminous efficiency.

When a light-emitting device is used as a display device, the color gamut of the display expands with decreasing width at half maximum of the emission spectrum of the phosphor. However, the width at half maximum of the emission spectrum of Ce-activated YAG is relatively broad, approximately 100 nm. When a light-emitting device that includes Ce-activated YAG as a yellow phosphor is used as a liquid crystal backlight for a display device, therefore, the color gamut will be insufficient.

Specifically, such display devices cover almost the entire sRGB color space, which is the color space for CRTs (cathode ray tubes), but not as much for the NTSC (National Television System Committee) and Adobe RGB color spaces, which are broader than the sRGB and used for wide color gamut liquid crystal displays.

To be more specific, display devices in which a Ce-activated YAG light-emitting device is used as a liquid crystal backlight cover approximately 70% of the NTSC and Adobe RGB color spaces. Such a light-emitting device is therefore not suitable for use in wide color gamut liquid crystal displays.

The sRGB color space is a color space inside the triangle defined by the following three chromaticity points on the CIE (Commission Internationale de l'Eclairage) 1931 color diagram: (CIEx, CIEy)=(0.640, 0.330), (0.300, 0.600), and (0.150, 0.060).

The NTSC color space is a color space inside the triangle defined by the following three chromaticity points on the CIE 1931 color diagram: (CIEx, CIEy)=(0.670, 0.330), (0.210, 0.710), and (0.140,0.080). The Adobe RGB color space is a color space inside the triangle defined by the following three chromaticity points on the CIE 1931 color diagram: (CIEx, CIEy)=(0.640, 0.330), (0.210, 0.710), and (0.150, 0.060). The NTSC and Adobe RGB color spaces have a larger gamut in terms of green than the sRGB color space.

A light-emitting device that can be used as a backlight in wide gamut liquid crystal displays, such as those supporting the NTSC or Adobe RGB, may have a configuration in which two phosphors, green and red, are used. The emission spectrum of these phosphors may have a relatively narrow width at half maximum.

For example, WO 2009/110285 (published on Sep. 11, 2009) discloses a light-emitting device that includes a combination of a Eu-activated β-SiAlON phosphor (a green phosphor) and a $Mn^{4+}$-activated fluoride complex (a red phosphor). This combination provides a wider color gamut than in the conventional configuration, in which a yellow phosphor is used, when the light-emitting device is used as a component of a display device. This is because the emission spectrum of both of the Eu-activated β-SiAlON phosphor and the $Mn^{4-}$-activated fluoride complex has a smaller width at half maximum than that of Ce-activated YAG. Specifically, the width at half maximum of the emission spectrum of the Eu-activated β-SiAlON phosphor is 55 nm or less, and that of the emission spectrum of the $Mn^{4+}$-activated fluoride complex is 10 nm or less.

Japanese Unexamined Patent Application Publication No. 2010-93132 (published on Apr. 22, 2010) discloses a light-emitting device that includes a combination of a Mn-activated γ-AlON phosphor (a green phosphor) and a $Mn^{4-}$-activated fluoride complex (a red phosphor), which is an example of a configuration capable of a color gamut even broader than that of light-emitting devices according to WO 2009/110285. This publication states that the emission spectrum of the green phosphor has a peak wavelength of 510 nm to 550 nm, with the width at half maximum of the emission spectrum being 55 nm or less (preferably 45 nm or less). The publication also mentions a Mn-activated γ-AlON phosphor whose emission spectrum has a peak wavelength and a width at half maximum of 515 nm and 33 nm, respectively, as a production example of a green phosphor.

Japanese Unexamined Patent Application Publication No. 2009-218422 (published on Sep. 24, 2009) discloses a light-emitting device that includes a Mn-activated oxide or nitride as a green phosphor. Specifically, this publication discloses a light-emitting device that includes a combination of such a green phosphor and a Eu-activated phosphor (a red phosphor). The publication states that the emission spectrum of the green phosphor has a width at half maximum of 40 nm or less. Similar to Japanese Unexamined Patent Application Publication No. 2010-93132, this publication mentions a Mn-activated γ-AlON phosphor whose emission spectrum has a peak wavelength and a width at half maximum of 515 nm and 33 nm, respectively, as a production example of a green phosphor.

Liquid crystal display devices smaller and thinner than before have been deemed useful in recent years. Light-emitting diodes for use as a backlight for liquid crystal display devices will be more beneficial if they not only improve the color reproduction of the liquid crystal display devices but also, as presented in Sharp Technical Data Sheet "SPECIFICATIONS Surface Mount LED GM5Fxxxx10A" (Jul. 24, 2015), are packaged in smaller light-emitting devices in which the package of the light-emitting diodes is 1 mm thick or thinner.

A Mn ($Mn^{2+}$)-activated γ-AlON phosphor is used in some cases as a green phosphor to improve color reproduction as in, for example, Japanese Unexamined Patent Application Publication Nos. 2010-93132 and 2009-218422. However, $Mn^{2+}$-activated γ-AlON phosphors are relatively inefficient in absorbing excitation light. For efficient absorption of excitation light, especially in such a small-sized light-emitting device, it may be recommended to increase the amount of the $Mn^{2-}$-activated γ-AlON phosphor.

However, a $Mn^{2+}$-activated γ-AlON phosphor used in an excessive quantity may affect the fluidity of the dispersing material. In such a case, the dispenser used to apply the dispersing material in which the $Mn^{2+}$-activated γ-AlON phosphor is dispersed can clog. Furthermore, light-emitting devices made with such a phosphor may emit light with varying chromaticities. The reduced fluidity of the dispersing material can therefore lead to a lower yield in the production of the device, which in turn can make the device difficult to mass-produce with consistent quality.

The configuration according to WO 2009/110285 includes a Eu-activated β-SiAlON phosphor, rather than a $Mn^{2+}$-activated γ-AlON phosphor, as a green phosphor. The Sharp technical data sheet appears to be silent regarding what kind of green phosphor is used.

Japanese Unexamined Patent Application Publication Nos. 2010-93132 and 2009-218422, which disclose Mn-activated γ-AlON phosphors as green phosphors, appear not to disclose or discuss countermeasures against the aforementioned decrease in the fluidity of dispersing material that can occur in small light-emitting devices.

It would therefore be desirable to provide a light-emitting device that includes a $Mn^{2+}$-activated γ-AlON phosphor as a green phosphor but can be produced with limited loss of yield and to provide a display device that includes such a light-emitting device.

SUMMARY

According to an aspect of the disclosure, there is provided a light-emitting device that includes a light-emitting element that emits blue light, a $Mn^{2+}$-activated γ-AlON phosphor that is excited by the blue light and emits green light, and a dispersing material in which the $Mn^{2+}$-activated γ-AlON phosphor is dispersed. The $Mn^{2+}$-activated γ-AlON phosphor has an in-crystal Mn concentration of 2.5 wt % or more, and the shortest path of the blue light through the dispersing material is 1 mm long or shorter.

BRIEF DESCRIPTION OF THE DRAWINGS

FIGS. 2A to 2E are graphical representations of the emission and excitation spectra of some green phosphors. FIG. 2A illustrates the emission and excitation spectrum of a green phosphor according to a Comparative Production Example, and FIGS. 2B to 2E illustrate those of green phosphors in Production Examples according to Embodiment 1 of the disclosure.

FIG. 3 is a table that summarizes the proportions of raw material powders and measurement results for the green phosphors according to these Comparative Production Example and Production Examples.

FIG. 4A illustrates the emission spectrum of a light-emitting device according to a Comparative Example, and FIGS. 4B to 4E illustrate that of light-emitting devices according to Examples.

FIG. 5 is a table that summarizes the ratio between dispersing material (resin) and a green phosphor and measurement results for the light-emitting devices according to Examples for Embodiment 1 of the disclosure and a Comparative Example.

FIGS. 9A to 9E are graphical representations of the emission spectrum of some light-emitting devices according to Embodiment 2 of the disclosure. FIG. 9A illustrates the emission spectrum of a light-emitting device according to a Comparative Example, and FIGS. 9B to 9E illustrate that of light-emitting devices according to Examples.

FIG. 10 is a table that summarizes the ratio between green and red phosphors dispersed in dispersing material (resin), the ratio between the dispersing material and the combined green and red phosphors, and measurement results for light-emitting devices according to Examples for Embodiment 2 of the disclosure and a Comparative Example.

FIG. 11A is an exploded perspective view of a display device according to Embodiment 3 of the disclosure. FIG. 11B is an exploded perspective view of a liquid crystal display unit used in the display device illustrated in FIG. 11A.

FIG. 13 is a table that summarizes the coverages, percent areas, and chromaticity coordinates of display devices according to Examples for Embodiment 3 of the disclosure.

FIG. 14 is a table that summarizes the ratio between green and red phosphors dispersed in dispersing material (resin), the ratio between the dispersing material and the combined green and red phosphors, and measurement results for light-emitting devices according to Examples in Embodiments 4 and 5 of the disclosure.

DESCRIPTION OF THE EMBODIMENTS

Figure 1:
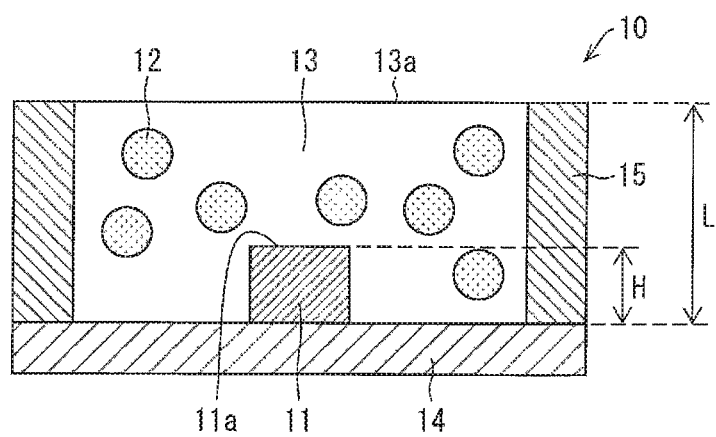
FIG. 1 is a cross-sectional view of a light-emitting device according to Embodiment 1 of the disclosure.

The following describes some embodiments of the disclosure in detail. Light-emitting devices 10 and 10a according to an aspect of the disclosure each include a light-emitting element 11 that emits blue light, a green phosphor 12 that is excited by the blue light and emits green light, and a dispersing material 13 in which the green phosphor 12 is dispersed. In the light-emitting devices 10 and 10a, the shortest path of the blue light through the dispersing material 13 is 1 mm long or shorter. In such light-emitting devices 10 and 10a, furthermore, the green phosphor 12 is a $Mn^{2+}$-activated γ-AlON phosphor, and the $Mn^{2+}$-activated γ-AlON phosphor has an in-crystal Mn concentration of 2.5 wt % or more.

After extensive research, the inventors found the following facts: making the in-crystal Mn concentration 2.5 wt % or more in such a small-sized light-emitting device whose shortest optical path is 1 mm or shorter limits the loss of the fluidity of the dispersing material 13 and thus improves the yield in the production of the device and makes the device more suitable for mass production; and the luminous efficiency of such a small light-emitting device can be improved by properly controlling the upper limit of the in-crystal Mn concentration, the ratio by weight of the green phosphor 12 (and the red phosphor 16) to the dispersing material 13, and the average particle diameter of the green phosphor 12 as well as making the in-crystal Mn concentration 2.5 wt % or more. The following describes these in more detail.

Embodiment 1

Embodiment 1 of the disclosure can be described with reference to FIGS. 1 to 8 as follows. This embodiment deals with a light-emitting device 10 that can be produced with at least improved yield.

Light-Emitting Device 10

FIG. 1 is a cross-sectional view of the light-emitting device 10. As illustrated in FIG. 1, the light-emitting device 10 includes a light-emitting element 11, a green phosphor 12, a dispersing material 13 in which the green phosphor 12 is dispersed, a printed circuit board 14, and a resin frame 15.

Because of increasing expectations that display devices, which incorporate light-emitting devices, will be thinner, the light-emitting device 10 may be small in size. The size of the light-emitting device 10 is determined by the length of the shortest path of blue light through the dispersing material 13.

In this embodiment, the depth L of the resin frame 15 is 0.9 mm, and the height H of the light-emitting element 11 is 0.1 mm. In such a light-emitting device 10, the length of the shortest path of the blue light emitted by the light-emitting element 11 through the dispersing material 13 is calculated to be 0.8 mm. In the light-emitting device 10 according to this embodiment, therefore, the short path of blue light through the dispersing material 13 does not exceed 1 mm. In other words, the light-emitting device 10 is a small light-emitting device whose shortest optical path is 1 mm or shorter.

The shortest optical path is defined as the shortest distance between the light emission surface 11a of the light-emitting element 11, through which blue light is emitted, and the light emission surface 13a of the dispersing material 13, through which green light produced by the green phosphor 12 comes out (actual shortest distance between the light emission surfaces 11a and 13a). The light emission surface 11a is the surface of the light-emitting element 11 opposite the surface facing the printed circuit board 14, and the light emission surface 13a is the surface of the dispersing material 13 farthest from the printed circuit board 14.

Light-Emitting Element 11

The light-emitting element 11 emits blue light. The light-emitting element 11 can be any material that emits blue light (excitation light) that is absorbed by the $Mn^{2+}$-activated γ-AlON phosphor as the green phosphor 12 and produces fluorescence. For example, the light-emitting element 11 can be a gallium nitride (GaN) semiconductor.

The blue light (excitation light) emitted by the light-emitting element 11 may have a peak wavelength of 440 nm or more and 460 nm or less. Ensuring that the blue light (excitation light) emitted by the light-emitting element 11 has a peak wavelength of 440 nm or more and 460 nm or less makes the excitation of the green phosphor 12 more efficient. The resulting high luminous efficiency of the light-emitting element 11, together with a good wavelength matching between the emission spectrum of the blue light and the transmission spectrum of the blue color filter 126b illustrated in FIG. 11, leads to an improved luminous efficiency of the light-emitting device 10 that is high enough that the device exhibits an intended possible luminous efficiency for use in display devices according to the disclosure.

When this peak wavelength is in the above range, furthermore, the light-emitting device 10 can be made with less green phosphor 12 because of the potentially high efficiency in the excitation of the green phosphor 12. The loss of yield in the production of the light-emitting device 10 and difficulty in mass-producing the device that would occur in association with reduced fluidity of the dispersing material 13 can therefore be addressed.

This peak wavelength may alternatively be 440 nm or more and 450 nm or less. This makes the excitation of the green phosphor 12 even more efficient, thereby leading to a further improvement in the luminous efficiency of the light-emitting device 10.

Figure 7:
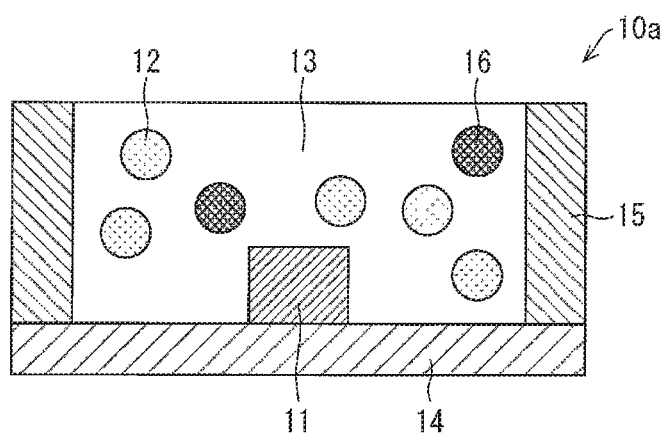
FIG. 7 is a cross-sectional view of a light-emitting device according to Embodiment 2 of the disclosure.

Furthermore, when its peak wavelength is 440 nm or more and 460 nm or less, preferably 440 nm or more and 450 nm or less, the emission spectrum of the blue light exhibits a good wavelength matching with the excitation spectrum of the red phosphor 16 in the light-emitting device 10a illustrated in FIG. 7 and with the transmission spectrum of the blue color filter 126b illustrated in FIG. 11. Making this peak wavelength 440 nm or more and 460 nm or less, preferably 440 nm or more and 450 nm or less, is therefore also effective in improving the luminous efficiency of the light-emitting device 10a, which emits white light.

Green Phosphor 12

The green phosphor 12, which is a wavelength-converting member that is excited by blue light coming from the light-emitting element 11 and emits green light, is a $Mn^{2+}$-activated γ-AlON phosphor.

The $Mn^{2-}$-activated γ-AlON phosphor used as green phosphor 12 in this embodiment has a composition represented by the formula $M_aA_bAl_cO_dN_e$ (where M denotes one or more metals including at least Mn of Mn, Ce, Pr, Nd, Sm, Eu, GD, Tb, Dy, Tm, and Yb, A denotes one or more metals other than M and Al, and a+b+c+d+e=1). The $Mn^{2+}$-activated γ-AlON phosphor may have a composition that meets conditions (1) to (5) below.

$$0.00001 \le a \le 0.1 \quad (1)$$

$$0 \le b \le 0.40 \quad (2)$$

$$0.10 \le c \le 0.48 \quad (3)$$

$$0.25 \le d \le 0.60 \quad (4)$$

$$0.02 \le e \le 0.35 \quad (5)$$

The $Mn^{2-}$-activated γ-AlON phosphor used as green phosphor 12 has an in-crystal Mn concentration of 2.5 wt % (% by weight) or more. This way of controlling the concentration of Mn improves the efficiency of the $Mn^{2+}$-activated γ-AlON phosphor in absorbing the excitation light, which would otherwise be low. By controlling the concentration of Mn, therefore, it is possible to address the reduced fluidity of dispersing material 13 that small-sized light-emitting devices like the light-emitting device 10 often experience owing to excessive use of a $Mn^{2+}$-activated γ-AlON phosphor aimed for higher luminous efficiency and chromaticity points suitable for image display.

Furthermore, although excessive use of a $Mn^{2+}$-activated γ-AlON phosphor in small light-emitting devices can lead to a lower luminous efficiency due to unnecessary scattering, controlling the concentration of Mn in the way described above also addresses this kind of loss of luminous efficiency. In particular, proper control of the in-crystal Mn concentration, the ratio by weight between the dispersing material 13 and the green phosphor 12, and the average particle diameter of the green phosphor 12 can be a way to produce the light-emitting device 10 with limited loss of luminous efficiency.

For example, too high a concentration of Mn generally leads to a low luminous efficiency of the $Mn^{2+}$-activated γ-AlON phosphor because of concentration quenching, low crystallinity, and so forth. In particular, Mn concentrations exceeding 4.6 wt % can result in a luminous efficiency lower than a level with which the device exhibits an intended possible luminous efficiency for use in display devices according to the disclosure. The concentration of Mn may therefore be 4.6 wt % or less to address this kind of loss of the luminous efficiency of the light-emitting device 10.

In general, smaller particle diameters of a phosphor lead to a higher yield in the production of the light-emitting device (a higher mass-production suitability of the device) because of less likelihood of dispenser clogging, but on the other hand result in a lower luminous efficiency of the device. Larger particle diameters of a phosphor generally lead to a higher luminous efficiency of the light-emitting device but at the same time result in a lower yield in the production of the device. This suggests that proper control of the particle diameters of the green phosphor 12 can be a way to combine a yield in the production of the light-emitting device with limited loss of luminous efficiency. The term "limited loss of luminous efficiency" as used herein means that when the light-emitting device is applied to, for example, display devices different from those according to the disclosure (e.g., display devices of lower color reproduction than that of display devices according to the disclosure) or illumination devices other than display devices, the luminous efficiency of the light-emitting device only needs to be high enough that for use in those display or illumination devices.

In view of these, the particle diameters of the $Mn^{2+}$-activated γ-AlON phosphor used as green phosphor 12 can be controlled to 5 μm or more and 40 μm or less on average, preferably 10 μm or more and 30 μm or less. The ratio by weight of the green phosphor 12 to the dispersing material 13 will be discussed hereinafter.

When the concentration of Mn is 2.5 wt % or more, the A in the formula $M_aA_bAl_cO_dN_e$ can be a divalent metal or metals such as Mg, Zn, and/or Ca, in particular Mg, so that more Mn can be taken into the γ-AlON crystals.

The Mg in the $Mn^{2+}$-activated γ-AlON phosphor helps the γ-AlON crystals taking in Mn by stabilizing their crystallographic structure. This leads to a further improvement in the luminous efficiency of the $Mn^{2+}$-activated γ-AlON.

The in-crystal Mn concentration is different from the concentration of Mn in the design formula, i.e., the concentration of Mn calculated from the proportions of raw material powders. The concentration of Mn in the $Mn^{2+}$-activated γ-AlON phosphor as mentioned herein refers to the in-crystal Mn concentration in the $Mn^{2+}$-activated γ-AlON phosphor as a finished product.

Mn is highly volatile and therefore easily changes into a gas and enters glass or other phases lying outside the γ-AlON crystals during high-temperature firing. It is possible to determine the concentration of Mn that actually exists in the γ-AlON crystals and contributes to light emission by, for example, direct measurement of the concentration of Mn in a cross-section of $Mn^{2+}$-activated γ-AlON crystals, i.e., calculating the concentration of Mn that actually exists in the crystals, rather than theoretical estimation from the design formula.

Dispersing Material 13

The dispersing material 13 is a material in which the $Mn^{2+}$-activated γ-AlON phosphor as green phosphor 12 is dispersed. In this embodiment, the dispersing material 13 is filled inside the resin frame 15. As illustrated in FIG. 1, the dispersing material 13 contains at least the green phosphor 12, a $Mn^{2+}$-activated γ-AlON phosphor, dispersed therein, and the light-emitting element 11 is sealed with this dispersing material 13 in which the green phosphor 12 is dispersed. As will be described in Embodiment 2, the dispersing material 13 may contain a red phosphor 16 dispersed therein besides the green phosphor 12 so that white can be produced as a blend of blue, green, and red.

Examples of materials that can be used as dispersing material 13 include, but are not limited to, transparent resin materials such as methyl silicone resins, phenyl silicone resins, epoxy resin, and acrylic resin, glass materials such as low-melting glass, and organic/inorganic hybrid glass. Resin materials allow the dispersing material 13 to be produced at lower temperatures than from other materials.

In this embodiment, a $Mn^{2-}$-activated γ-AlON phosphor, which is a phosphor activated with a light-emitting element $Mn^{2-}$, an ion with low emission and absorption transition probabilities, is used in a small light-emitting device 10 whose shortest optical path is 1 mm or shorter. Thus, as mentioned above, the concentration of the activator Mn is properly adjusted to control the amount of green phosphor 12 dispersed in the dispersing material 13 and thereby to limit the loss of the fluidity of the dispersing material 13 containing the green phosphor 12 (a mixture of the green phosphor 12 and the dispersing material 13).

In this respect, the ratio by weight of the green phosphor 12 to the dispersing material 13 can be 1.2 or less, at least in order to limit the loss of the fluidity of the dispersing material 13. In other words, (weight of green phosphor 12)/(weight of dispersing material 13) may be 1.2 or less. This improves the yield in the production of the light-emitting device 10 and makes the device more suitable for mass production by limiting the loss of the fluidity of the dispersing material 13 in which the green phosphor 12 has been dispersed.

This weight ratio may alternatively be 1.0 or less. In other words, (weight of green phosphor 12)/(weight of dispersing material 13) may be 1.0 or less. This leads to an even smaller loss of fluidity.

This weight ratio may be greater than 0.5. In other words, (weight of green phosphor 12)/(weight of dispersing material 13) may be greater than 0.5. Making this ratio greater than 0.5 controls the chromaticity point of the light emitted by the light-emitting device 10 (e.g., white light) to a suitable range, a range in which the light-emitting device can be used in a display device according to the disclosure.

Other Components of the Light-Emitting Device 10

The printed circuit board 14 is a substrate that supports the light-emitting element 11 and electrical circuitry used to drive the light-emitting element 11. The resin frame 15 is a frame, made from resin, placed on the printed circuit board 14.

Production of Green Phosphor 12

The following describes some Production Examples of green phosphors 12 and a Comparative Example using FIGS. 2A to 2E and 3.

FIG. 2A is a graphical representation of the emission and excitation spectra of the green phosphor according to Comparative Production Example P0. FIGS. 2B to 2E are graphical representations of the emission and excitation spectra of the green phosphors 12 according to Production Examples P1 to P4. The emission and excitation spectra of the green phosphors 12 according to Production Examples P5 and P6 are identical to those in Production Example P1.

FIG. 3 is a table that summarizes the proportions of raw material powders and measurement results for the green phosphor 12 according to Comparative Production Example P0 and the green phosphors 12 according to Production Examples P1 to P6. The specific measurement results summarized in FIG. 3 are the width at half maximum, peak wavelength, and chromaticity coordinates of the emission spectrum, the in-crystal concentration of Mn in the green phosphor, and the average particle diameter of the green phosphor.

Comparative Production Example P0: Preparation of $Mn^{2+}$-Activated γ-AlON Phosphor Firing A production example (Comparative Production Example P0) of a green phosphor 12 for comparison with green phosphors 12 according to this embodiment is first described with reference to FIGS. 2A and 3.

For the production of the $Mn^{2+}$-activated γ-AlON phosphor according to Comparative Production Example P0, powders of aluminum nitride, aluminum oxide, magnesium oxide, and manganese fluoride were mixed in the proportions given in FIG. 3.

To be more specific, predetermined amounts of the powders were weighed out to make a composition containing 10.70% by mass aluminum nitride, 79.86% by mass aluminum oxide, 4.68% by mass magnesium oxide, and 4.76% by mass manganese fluoride. The powders were then mixed using a silicon nitride-sintered mortar and pestle for at least 10 minutes to give a powder aggregate. This powder aggregate was put into a boron nitride crucible measuring 20 mm across and 20 mm long by dropping the aggregate into the crucible.

The crucible was then placed in a graphite-resistance-heating pressure electric furnace. Nitrogen of 99.999% by volume purity was introduced into this pressure electric furnace to make the internal pressure 0.5 MPa, and the temperature was elevated to 1800° C. at a rate of 500° C. per hour. The crucible was maintained at 1800° C. for 2 hours in the pressure electric furnace. In this way, a phosphor sample was obtained.

Grinding and Classification

The phosphor sample was wet-ground with a small amount of purified water in an agate mortar, and the resulting powder was screened through a 48-μm-mesh sieve to remove coarse particles. This cycle of grinding the phosphor sample and removing coarse particles was repeated several times. The phosphor sample from which coarse particles had been removed was dispersed in an aqueous solution of 0.1 wt % hexametaphosphoric acid in purified water and allowed to stand for a while. The supernatant was then removed to eliminate fine particles. In this way, a phosphor powder was obtained with controlled particle diameters.

Measurement

The resulting phosphor powder was analyzed by powder X-ray diffraction (XRD) with Cu Kα radiation. All charts obtained from this phosphor powder indicated that the powder had the γ-AlON structure. The phosphor powder emitted green light when exposed to light with a wavelength of 365 nm. Through the foregoing process, the $Mn^{2+}$-activated γ-AlON phosphor powder according to Comparative Production Example P0 was obtained.

The resulting green phosphor according to Comparative Production Example P0 was then irradiated with light of 445 nm, and this gave the emission spectrum illustrated in FIG. 2A. Specifically, this emission spectrum was measured by exciting the green phosphor with light of 445 nm using a spectrophotometer (Otsuka Electronics MCPD-7000). The excitation spectrum was obtained by monitoring the peak wavelength of the emission spectrum.

An analysis of the emission spectrum in FIG. 2A revealed that the peak wavelength and width at half maximum of the emission spectrum of the green phosphor according to Comparative Production Example P0 were 522 nm and 38 nm, respectively, as presented in FIG. 3. The chromaticity coordinates (CIEx, CIEy) on the CIE 1931 color diagram calculated from this emission spectrum were (0.204, 0.721).

Then the phosphor sample was subjected to the measurement of average particle diameter. In an electron microscopic image obtained using an SEM (scanning electron microscope; Keyence VE-8800), the average particle diameter was measured to be 13.5 μm.

The in-crystal Mn concentration in the green phosphor according to Comparative Production Example P0 was then measured.

The following procedure was used to calculate the in-crystal Mn concentration in the green phosphor. The phosphor powder obtained through the above-described process was first dispersed in epoxy resin (JEOL G2). The epoxy resin in which the phosphor powder was dispersed was then irradiated with an Ar-ion beam using a cross-section polisher (JEOL SM-09010) to cut the phosphor embedded in the epoxy resin. The concentration of Mn was then measured on multiple cross-sections using an EDX (energy dispersive X-ray spectrometry) detector (Ametek G-XM2) supplied with the SEM, and the average was taken as the concentration of Mn.

The in-crystal Mn concentration in the green phosphor according to Comparative Production Example P0 calculated in this way was, as presented in FIG. 3, 2.4 wt %.

The width at half maximum of the peak near 445 nm in the excitation spectrum of the green phosphor according to Comparative Production Example P0 was, as presented in FIG. 3, 23 nm.

Production Examples P1 TO P4: Preparation of $Mn^{2+}$-Activated γ-AlON Phosphor The following describes some production examples of green phosphors 12 according to this embodiment with reference to FIGS. 2B to 2E and 3.

The $Mn^{2-}$-activated γ-AlON phosphors (green phosphors 12) according to Production Examples P1 to P4 were produced through the same process as in Comparative Production Example P0. That is, the green phosphors 12 according to these Production Examples were produced by mixing powders of aluminum nitride, aluminum oxide, magnesium oxide, and manganese fluoride in the proportions given in FIG. 3.

The resulting green phosphors 12 according to Production Examples P1 to P4 were then each irradiated with light of 445 nm, and this gave the emission spectra illustrated in FIGS. 2B to 2E. Specifically, these emission spectra were measured in the same way as in Comparative Production Example P0, by exciting the green phosphor by irradiating it with light of 445 nm using a spectrophotometer (Otsuka Electronics MCPD-7000). The excitation spectra were obtained by monitoring the peak wavelength of the emission spectra. The in-crystal Mn concentration and average particle diameter of the green phosphors 12 according to Production Examples P1 to P4 were also calculated in the same way as in Comparative Production Example P0.

The chromaticity coordinates and average particle diameters for the green phosphors 12 according to Production Examples P1 to P4 were as summarized in FIG. 3. A notable finding is that the in-crystal Mn concentrations in the green phosphors 12 according to Production Examples P1 to P4 were not less than 2.5 wt %, unlike in Comparative Production Example P0. For the green phosphors 12 according to Production Examples P1 to P4, the width at half maximum of the peak near 445 nm in the emission spectrum was 25, 25, 26, and 28 nm, respectively.

Production Example P5: Preparation of
Mn$^{2+}$-Activated γ-AlON Phosphor

The grinding and classification in Production Example P1 was changed as follows to obtain a Mn$^{2+}$-activated γ-AlON phosphor (green phosphor 12) according to Production Example P5.
Grinding and Classification The phosphor sample was wet-ground with a small amount of purified water in an agate mortar, and the resulting powder was screened through an 85-μm-mesh sieve to remove coarse particles. This cycle of grinding the phosphor sample and removing coarse particles was repeated several times. The phosphor sample from which coarse particles had been removed was dispersed in an aqueous solution of 0.1 wt % hexametaphosphoric acid in purified water and allowed to stand for a while. The supernatant was then removed to eliminate fine particles. In this way, a phosphor powder was obtained with controlled particle diameters.
Measurement The phosphor sample was subjected to measurement in the same way as in Production Example P1. The results were the same as in Production Example P1 except for the average particle diameter, 25.1 μm.

Production Example P6: Preparation of
Mn$^{2+}$-Activated γ-AlON Phosphor

The grinding and classification in Production Example P1 was changed as follows to obtain a Mn$^{2+}$-activated γ-AlON phosphor (green phosphor 12) according to Production Example P6.
Grinding and Classification The phosphor sample was wet-ground with a small amount of purified water in an agate mortar, and the resulting powder was screened through a 20-μm-mesh sieve to remove coarse particles. This cycle of grinding the phosphor sample and removing coarse particles was repeated several times. The phosphor sample from which coarse particles had been removed was dispersed in an aqueous solution of 0.1 wt % hexametaphosphoric acid in purified water and allowed to stand for a while. The supernatant was then removed to eliminate fine particles. In this way, a phosphor powder was obtained with controlled particle diameters.
Measurement The phosphor sample was subjected to measurement in the same way as in Production Example P1. The results were the same as in Production Example P1 except for the average particle diameter, 7.6 μm.

Examples and a Comparative Example of
Light-Emitting Devices

Figure 4A:
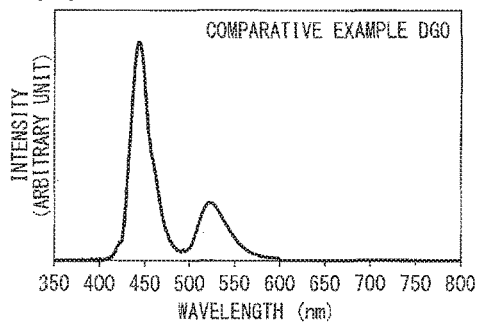
FIGS. 4A to 4E are graphical representations of the emission spectrum of some light-emitting devices according to Embodiment 1 of the disclosure.
Figure 4B:
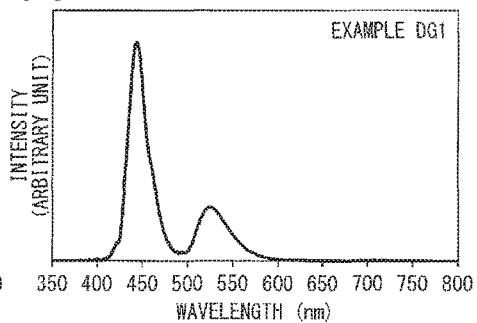
Figure 4C:
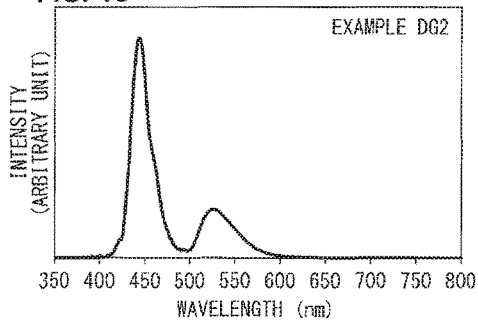
Figure 4D:
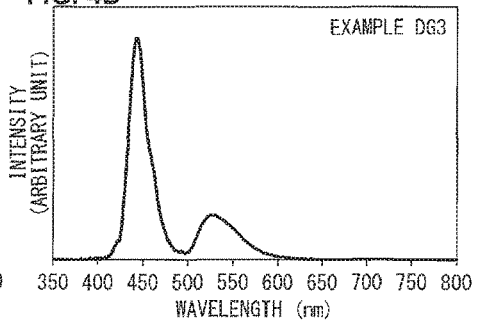
Figure 4E:
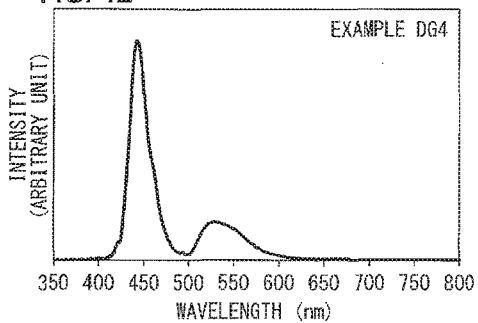

The following describes some light-emitting devices 10 and a comparative example using FIGS. 4A to 4E and 5. FIG. 4A is a graphical representation of the emission spectrum of a light-emitting device according to Comparative Example DG0. FIGS. 4B to 4E are graphical representations of the emission spectra of light-emitting devices 10 according to Examples DG1 to DG4. The emission spectra in Examples DG5 and DG6 were identical to that in Example DG1. In the graphs in FIGS. 4A to 4E, the vertical axis represents luminous intensity (arbitrary unit), and the horizontal axis represents wavelength (nm).

FIG. 5 is a table that summarizes the ratio between dispersing material (resin) and a Mn$^{2+}$-activated γ-AlON phosphor (green phosphor) and measurement results for the light-emitting devices 10 according to Examples DG1 to DG6 and the device according to Comparative Example DG0.

The specific measurement results summarized are (1) the theoretical limit of luminous efficiency (TLLE) of the device, (2) the (relative) luminous flux of the light emitted by the device, with that of the light emitted by the light-emitting device 10 according to Example DG3 taken as 100, (3) the mass-production suitability of the light-emitting device 10, and (4) the chromaticity coordinates of the light emitted by the device through a liquid crystal panel (corresponding to the liquid crystal display portion 120). In FIG. 5 (and FIG. 10), the mass-production suitability is "good" for devices that can be easily mass-produced (suitable for mass production), "unacceptable" for devices that cannot (unsuitable for mass production), and "acceptable" for devices with a certain suitability that permits mass production.

The chromaticity coordinates of each device were adjusted so that the CIEy would be near 0.150 as presented in FIG. 5. These CIEy values were calculated for a white light that would be obtained when adding a red phosphor (described hereinafter) to the dispersing material besides the green phosphor and blending red light from this red phosphor with the blue light from the light-emitting element and the green light from the green phosphor. Specifically, these CIEy values are based on the assumption that the light-emitting device emits a white light suitable for display devices and were calculated from the ratio between the peak intensities of the blue and green lights in such a white light.

Comparative Example DG0

A production example (Comparative Example DG0) of a light-emitting device for comparison with light-emitting devices 10 according to this embodiment is first described with reference to FIGS. 4A and 5.

The light-emitting device according to Comparative Example DG0 was structurally equivalent to the light-emitting devices 10, which had the structure illustrated in FIG. 1. In the light-emitting device according to Comparative Example DG0, the light-emitting element was a blue LED with a peak emission wavelength of 445 nm (Cree). The green phosphor was the Mn$^{2+}$-activated γ-AlON phosphor obtained in Comparative Production Example P0, and the dispersing material was silicone resin (Shin-Etsu Chemical KER-2500).

First, the Mn$^{2+}$-activated γ-AlON phosphor of Comparative Production Example P0 was dispersed in the silicone resin to give a phosphor-dispersed resin. Specifically, this phosphor-dispersed resin was obtained by mixing the Mn$^{2}$-activated γ-AlON phosphor and the silicone resin in a weight ratio of 1.33:1. The phosphor-dispersed resin was kneaded using a planetary centrifugal mixer (Thinky AR-100) and manually applied to the inside of a resin frame using a needle-shaped jig. The silicone resin was cured by heating at 150° C. to complete the light-emitting device.

The emission spectrum of the resulting light-emitting device measured with a driving current of 20 mA using a spectrophotometer (Otsuka Electronics MCPD-7000) was as illustrated in FIG. 4A.

As mentioned above, the amount of dispersed Mn$^{2+}$-activated γ-AlON phosphor in Comparative Example DG0 was adjusted so that the chromaticity coordinate CIEy of the emission spectrum of the device would be near 0.150.

Examples DG1 to DG6

The following describes some production examples of light-emitting devices 10 according to this embodiment (Examples DG1 to DG6) with reference to FIGS. 4B to 4E and 5.

The light-emitting devices 10 according to Examples DG1 to DG6 had the structure illustrated in FIG. 1. In the light-emitting devices 10 according to Examples DG1 to DG6, the light-emitting element 11 was a blue LED with a peak emission wavelength of 445 nm. The green phosphor 12 was the $Mn^{2+}$-activated γ-AlON phosphor obtained in Production Examples P1 to P6, and the dispersing material 13 was silicon resin (Shin-Etsu Chemical KER-2500).

The $Mn^{2-}$-activated γ-AlON phosphors (green phosphors 12) of Production Examples P1 to P6 were mixed with the dispersing material 13 in the weight ratio given in FIG. 5. The light-emitting devices 10 were produced in the same way as in Comparative Example DG0.

Evaluation of Light-Emitting Devices: Mass-Production Suitability

For the light-emitting devices of Comparative Example DG0 and Examples DG1 to DG6, the mass-production suitability (yield in the production) of light-emitting devices 10 was investigated.

In the light-emitting devices of Examples DG1 to DG6, as can be seen from FIG. 5, the ratio by weight of the green phosphor 12 to the dispersing material 13 was not more than 1.2. In other words, (weight of green phosphor 12)/(weight of dispersing material 13)≤1.2.

The application of phosphor-dispersed resin in the production of the light-emitting devices according to Examples DG1 to DG6 and Comparative Example DG0 was manual work. In this evaluation of mass-production suitability, a dispenser appropriate for the mass production of light-emitting devices was used to apply the phosphor-dispersed resin. Specifically, the phosphor-dispersed resin was continuously applied to 100 light-emitting devices using a dispenser for the mass production of light-emitting devices (Musashi Engineering Super ΣCM II) and an applicator (Musashi Engineering SHOTMASTER® 300).

In Examples DG1 to DG6, the 100 produced light-emitting devices 10 successfully completed the continuous application of phosphor-dispersed resin. The 100 light-emitting devices 10 produced in Example DG1 exhibited little variation in the color of emitted light, with the distribution of CIEy values falling within a range of ±0.02. In Examples DG2, DG3, and DG6, too, the variations in CIEy in the color of emitted light among the 100 produced light-emitting devices 10 were in a range of ±0.02. As for Examples DG4 and DG5, the variations in CIEy in the color of emitted light among the 100 produced light-emitting devices 10 were ±0.04. These values indicate that the light-emitting devices 10 according to Examples DG1 to DG6 are uniform in color to a degree that they can be implemented in practical settings. These values can therefore translate into good mass-production suitability of light-emitting devices 10 according to Examples DG1 to DG6.

In Comparative Example DG0, the dispenser clogged before completing the continuous application of phosphor-dispersed resin to the 100 light-emitting devices. The 100 light-emitting devices according to Comparative Example DG0 therefore failed to complete application. Those of the light-emitting devices according to Comparative Example DG0 to which a predetermined amount of phosphor-dispersed resin was successfully applied displayed great variation in color, with the CIEy values ranging beyond ±0.05.

The cause is considered to be the in-crystal Mn concentration in the light-emitting devices according to Comparative Example DG0, which was 2.4 wt % and therefore less than 2.5 wt %. An excessive amount of green phosphor was dispersed in the dispersing material to compensate for the related loss of luminous efficiency, affecting the fluidity of the phosphor-dispersed resin.

The light-emitting devices according to Examples DG1 to DG6 were therefore superior to that according to Comparative Example DG0 in terms of yield in production and, accordingly, mass-production suitability.

The light-emitting devices 10 illustrated in Examples DG1, DG2, and DG6 satisfied the condition that (weight of green phosphor 12)/(weight of dispersing material 13)≤1.0, and these light-emitting devices 10 were of particularly high mass-production suitability. Even when the ratio by weight of the green phosphor 12 to the dispersing material 13 exceeded 1.0, the mass-production suitability of the light-emitting device 10 remained as high as in Examples DG1, DG2, and DG6 inasmuch as the weight ratio was close to 1.0, as in Example DG3.

Evaluation of Light-Emitting Devices: Luminous Efficiency

Figure 6:
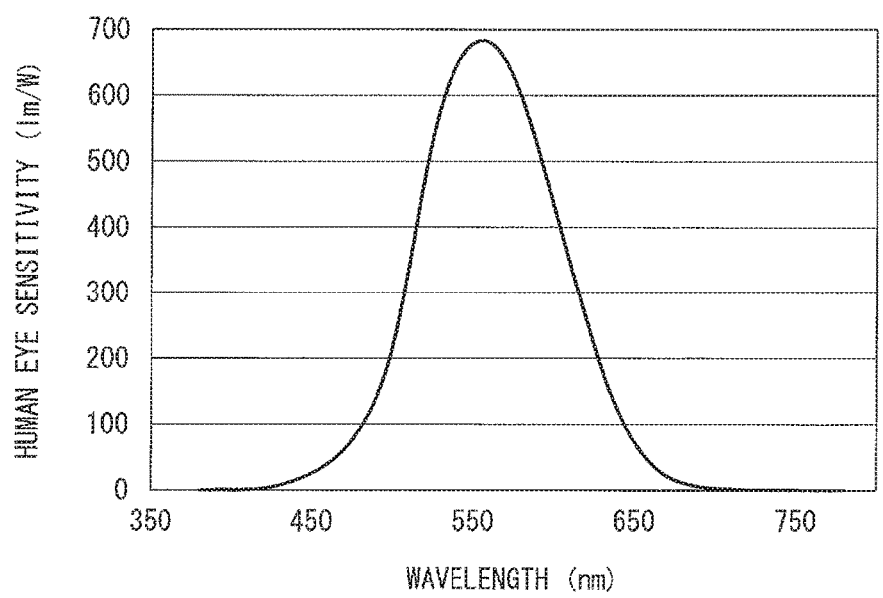
FIG. 6 is a graphical representation of the luminosity function (lm/W) of human eyes.

A test calculation was made to determine the luminous efficiency of the light-emitting devices of Comparative Example DG0 and Examples DG1 to DG6. FIG. 6 is a graphical representation of the luminosity function (lm/W) of human eyes.

In this test calculation, the theoretical limit of luminous efficiency (TLLE) of the light-emitting devices according to Comparative Example DG0 and Examples DG1 to DG6 was determined with equation (1), where the wavelength is λ (nm), the value in the emission spectrum of the light-emitting device illustrated in FIGS. 4A to 4E is LED (λ), the value in the luminosity function of FIG. 6 is V (λ), and the peak wavelength of the excitation blue light is $λ_{EX}$ (=445 nm)

$$TLLE = \frac{\int LED(\lambda) \times V(\lambda) d\lambda}{\int LED(\lambda) \times (\lambda/\lambda_{EX}) d\lambda}$$

The TLLE is a theoretical limit of the luminous efficiency of a light-emitting device calculated from the shape of the emission spectrum of the light emitted by the device assuming that the theoretically inevitable Stokes loss associated with wavelength conversion is the only loss of energy.

As is summarized in FIG. 5, the light-emitting devices 10 according to Examples DG1 to DG6 exhibit high TLLE compared with the device according to Comparative Example DG0. This result is attributable to the good wavelength matching of the shape of the emission spectrum of the green phosphor 12 in the light-emitting devices 10 according to Examples DG1 to DG6 with the luminosity function of FIG. 6 as compared with the shape of the emission spectrum of the green phosphor in the device according to Comparative Example DG0. In test calculations, therefore, the light-emitting devices 10 according to Examples DG1 to DG6 are superior or equivalent to the device according to Comparative Example DG0 in terms of luminous efficiency if the luminous efficiency of the $Mn^{2+}$-activated γ-AlON phosphor is comparable between the light-emitting devices 10 according to Examples DG1 to DG6 and the device according to Comparative Example DG0.

When these light-emitting devices were compared with regard to luminous flux, a measure of the brightness of a light-emitting device, the light-emitting devices 10 according to Examples DG1, DG2, and DG5 exhibited higher luminous flux than the device according to Comparative Example DG0, as indicated in FIG. 5. That is, the light-emitting devices 10 according to Examples DG1, DG2, and DG5 had higher luminous efficiency than the device according to Comparative Example DG0.

This result is attributable to the good wavelength matching of the emission spectrum of the $Mn^{2+}$-activated γ-AlON phosphor with the luminosity function of FIG. 6 in the light-emitting devices 10 according to Examples DG1, DG2, and DG5 as compared with the device according to Comparative Example DG0.

Furthermore, as is summarized in FIG. 3, the in-crystal Mn concentrations in the light-emitting devices 10 according to Examples DG1 to DG6 were not less than 2.5 wt %, whereas that in the light-emitting device 10 according to Comparative Example DG0 was 2.4 wt %. Light-emitting devices according to Comparative Example DG0 may thus need large amounts of $Mn^{2+}$-activated γ-AlON phosphor compared with light-emitting devices 10 according to Examples DG1 to DG6. The efficiency in harvesting light from such devices can possibly be low because of a high likelihood of light losses due to unnecessary scattering. Thus in this respect, too, at least light-emitting devices 10 according to Examples DG1, DG2, and DG5 are superior to devices according to Comparative Example DG0 in terms of luminous efficiency when the upper limit of the in-crystal Mn concentration and the average particle diameter of the $Mn^{2+}$-activated γ-AlON phosphor are properly controlled as described hereinafter.

When making a comparison between, for example, the light-emitting device according to Comparative Example DG0 and the light-emitting devices 10 according to Examples DG1 and DG2, one may consider controlling the amount of the green phosphor so as to satisfy the condition that, for example, (weight of green phosphor)/(weight of dispersing material)<0.5. This would reduce the influence of light scattering by the green phosphor when luminous efficiency is compared between the devices in a region where CIEx is smaller than 0.281 and/or CIEy is smaller than 0.288 with respect to the white point of the light emitted by the display device. When (weight of green phosphor)/(weight of dispersing material)<0.5, therefore, the luminous flux of the light emitted by light-emitting devices according to Comparative Example DG0 could be comparable to that of the light emitted by light-emitting devices 10 according to Example DG1 or DG2. However, the chromaticity point of the light emitted by the display device in such a case would greatly deviate from the intended white point. Control to meet the condition that (weight of green phosphor)/(weight of dispersing material)<0.5 may be unnecessary for the practical use of display devices.

The luminous flux of the light emitted by the light-emitting device 10 according to Example DG3 in FIG. 5 was high enough that the device would exhibit an intended possible luminous efficiency for use in display devices according to the disclosure. The light emitted by the light-emitting device according to Example DG4 had a lower luminous flux than that emitted by the light-emitting device 10 according to Example DG3, demonstrating that the device failed to achieve an intended possible luminous efficiency for use in display devices according to the disclosure. As presented in FIG. 3, the in-crystal Mn concentration in Example DG3 was 4.56 wt %, and that in Example DG4 was 4.7 wt %. Light-emitting devices 10 that combine superior mass-production suitability and an intended possible luminous efficiency for use in display devices according to the disclosure can therefore be made possible by making the in-crystal Mn concentration 4.6 wt % or less.

The light-emitting device 10 according to Example DG4 was, however, superior at least in mass-production suitability. When applied to display devices different from those according to the disclosure or illumination devices other than display devices, for example, even this light-emitting device can retain a luminous efficiency sufficient for use in those display or illumination devices.

The light-emitting device 10 according to Example DG6 had, as presented in FIG. 3, the same in-crystal Mn concentration as that according to Example DG1. The luminous efficiency was, however, lower in the light-emitting device 10 according to Example DG6 than in that according to Example DG1, as can be seen from FIG. 5. This result appears to be attributable to excessive light scattering caused by the relatively small average particle diameter of the green phosphor 12 in Example DG6, 7.6 μm (see FIG. 3). However, similar to Example DG4, the light-emitting device 10 according to Example DG6 also has the potential to retain a luminous efficiency sufficient for use in, for example, display devices different from those according to the disclosure or illumination devices.

In conclusion, it is possible to improve the luminous efficiency and mass-production suitability of a light-emitting device through proper control of the concentration of the emission activator Mn and average particle diameter of the green phosphor 12. $Mn^{2+}$-activated γ-AlON phosphors are not very efficient in absorbing excitation light. For such phosphors, as compared with the commonly used $Eu^{2-}$-activated green phosphors, the control of the emission activator concentration and the particle diameter is particularly effective.

Embodiment 2

Another embodiment of the disclosure, Embodiment 2, can be described with reference to FIGS. 7 to 10 as follows. This embodiment deals with a light-emitting device 10a according to another embodiment of the light-emitting device 10 described in Embodiment 1. For the sake of simplicity, this section designates any component that has the same function as one in the previous embodiment with the same reference numeral as that one instead of repeating its details.

Light-Emitting Device 10a

As illustrated in FIG. 7, the light-emitting device 10a includes a light-emitting element 11, a green phosphor 12, a dispersing material 13, a printed circuit board 14, a resin frame 15, and a red phosphor 16. The light-emitting device 10a according to this embodiment therefore differs from the light-emitting device 10 according to Embodiment 1 in that it contains the red phosphor 16. The light-emitting device 10a can emit white light by blending blue light from the light-emitting element 11, green light from the green phosphor 12, and red light from the red phosphor 16. The term "emit white light" may mean either that the light-emitting device 10a itself emits white light or that a display device (described hereinafter) emits white light.

Red Phosphor 16

The red phosphor 16, which is a wavelength-converting member that is excited by blue light coming from the light-emitting element 11 and emits red light, is a $Mn^{4+}$-activated phosphor.

Any suitable $Mn^{4-}$-activated phosphor selected from $Mn^{4+}$-activated fluoride complex, $Mn^{4+}$-activated oxide, Mn$^{4+}$-activated oxyfluoride, and other Mn$^{4+}$-activated phosphors can be used. In particular, Mn$^{4+}$-activated fluoride complex phosphors offer superior color reproduction in the red spectrum because of the narrow width at half maximum of the emission spectrum of the red lights they emit, such as 10 nm or less, and can be excited with blue light with higher efficiency.

Examples of Mn$^{4+}$-activated fluoride complex phosphors that can be used as red phosphor 16 include those represented by general formula (A) or (B). Any Mn$^{4+}$-activated fluoride complex phosphor represented by formula (A) or (B) has an emission spectrum with the aforementioned very narrow width at half maximum of 10 nm or less, by virtue of the nature of Mn$^{4+}$ as light-emitting ion.

$$MI_2(MII_{1-h}Mn_h)F_6 \qquad \text{General formula (A)}$$

In formula (A), MI denotes at least one alkali metal selected from the group consisting of Li, Na, K, Rb, and Cs. MII denotes at least one tetravalent metal selected from the group consisting of Ge, Si, Sn, Ti, and Zr. The value h may be between 0.001 and 0.1.

The MI in formula (A) may be K because it leads to high luminous intensity and high stability of phosphor crystals. For the same reasons, MII may include Ti or Si.

The value h in formula (A) represents the proportion (concentration) of Mn in the composition and therefore the concentration of Mn$^{4+}$. When h is less than 0.001, too low a concentration of the light-emitting ion Mn$^{4+}$ may lead to problems such as insufficient brightness. When h exceeds 0.1, the brightness will be very low for reasons such as concentration quenching.

The Mn$^{4-}$-activated fluoride complex phosphor of formula (A) can therefore be $K_2(Ti_{1-h}Mn_h)F_6$ or $K_2(Si_{1-h}Mn_h)F_6$ with h being 0.001 or more and 0.1 or less.

$$MIII(MII_{1-h}Mn_h)F_6 \qquad \text{General formula (B)}$$

In formula (B), MIII denotes at least one alkaline earth metal selected from the group consisting of Mg, Ca, Sr, and Ba. MII denotes at least one tetravalent metal selected from the group consisting of Ge, Si, Sn, Ti, and Zr. The value h may be between 0.001 and 0.1.

The MIII in formula (B) may include at least Ba because it makes the phosphor more efficient in light emission and more resistant to heat and external force. For the same reasons, MII may include Ti or Si.

In particular, including Si in MII will make the Mn$^{4+}$-activated fluoride complex phosphor, whether formula (A) or (B), less soluble in water and therefore more waterproof. As in formula (A), the value h in formula (B) for the proportion (concentration) of Mn in the composition can be between 0.001 and 0.1.

Production of Red Phosphor 16

Figure 8:
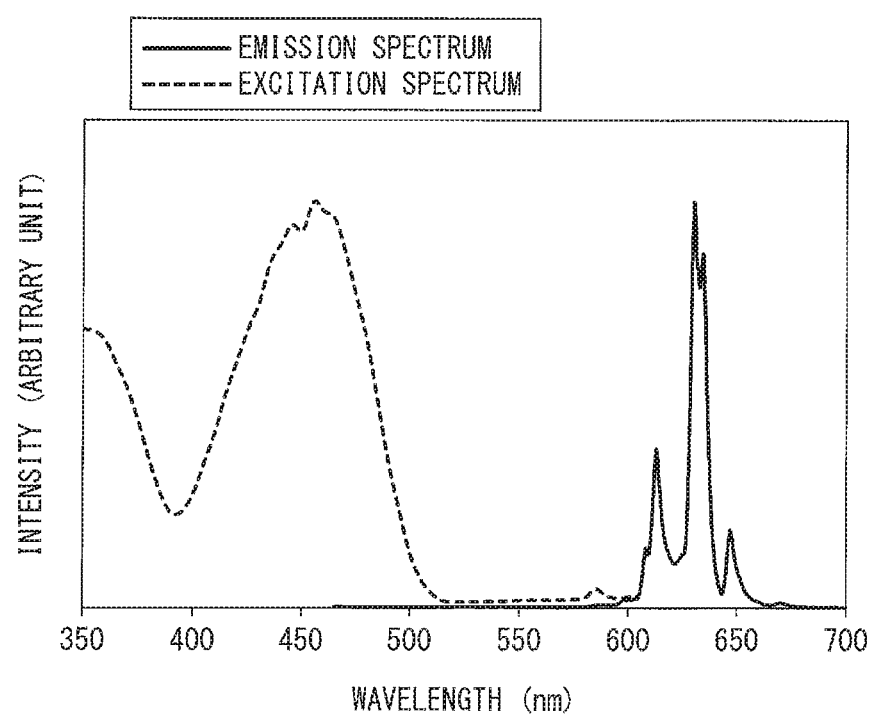
FIG. 8 is a graphical representation of the emission and excitation spectra of a red phosphor according to a Production Example for Embodiment 2 of the disclosure.

The following describes a red phosphor 16 using FIG. 8. FIG. 8 is a graphical representation of the emission and excitation spectra of the red phosphor 16 according to Production Example R1. Production Example R1 produced a Mn$^{4-}$-activated $K_2SiF_6$ phosphor as red phosphor 16.

Production Example R1: Preparation of Mb$^{4+}$-Activated $K_2SiF_6$ Phosphor

A Mn$^{4+}$-activated fluoride complex phosphor having a composition of formula (A), $MI_2(MII_{1-h}Mn_h)F_6$, in which MI was K, MII was Si, and h=0.06 was prepared through the following procedure.

A vinyl chloride resin reaction vessel was partitioned into halves with a fluororesin ion-exchange membrane (a diaphragm), with a platinum plate for use as anode in one of the two membrane-separated compartments and another for use as cathode in the other compartment. The anode and cathode sides of the reaction vessel were loaded with an aqueous solution of hydrofluoric acid, with manganese (II) fluoride dissolved on the anode side.

With the anode and cathode connected to a power supply, the solution was electrolyzed performed at a voltage of 3 V and a current of 0.75 A. An aqueous solution of hydrofluoric acid saturated with potassium fluoride was added in an excessive quantity to the electrolyzed reaction solution on the anode side, yielding a yellow solid of $K_2MnF_6$. The yellow solid was collected by filtration. In this way, $K_2MnF_6$ was obtained.

Then 4.8 g of silicon dioxide was dissolved in 100 cm$^3$ of a 48% by mass aqueous solution of hydrofluoric acid to give an aqueous solution containing silicon fluoride. After cooling down to room temperature, the aqueous solution was transferred to a resin container with a lid and warmed by holding the container for at least 1 hour in a water bath maintained at 70° C. This silicon-fluoride-containing aqueous solution was stirred with 1.19 g of the prepared $K_2MnF_6$ powder until dissolution. In this way, a solution containing silicon fluoride and $K_2MnF_6$ (a first solution) was prepared.

Then 13.95 g of potassium fluoride was dissolved in 40 cm$^3$ of a 48% by mass aqueous solution of hydrofluoric acid, and the resulting solution was allowed to cool to room temperature. In this way, an aqueous solution containing potassium fluoride (a second solution) was prepared.

The second solution was then added to the first solution, with stirring, over approximately 2.5 minutes. About 10 minutes of stirring gave a pale orange solid. The solid was isolated by filtration and washed with a small amount of 20% by mass aqueous solution of hydrofluoric acid. The solid was then further washed with ethanol and dried in a vacuum. In this way, the Mn$^{4+}$-activated $K_2SiF_6$ phosphor according to Production Example R1 was obtained in a powder form.

The resulting phosphor powder was analyzed by powder X-ray diffraction (XRD) with Cu Kα radiation. All charts obtained from this phosphor powder indicated that the powder had the $K_2SiF_6$ structure. The phosphor powder emitted red light when exposed to light with a wavelength of 365 nm.

The resulting red phosphor 16 according to Production Example R1 was then irradiated with light of 445 nm, and this gave the emission spectrum illustrated in FIG. 8. Specifically, this emission spectrum was measured by exciting the red phosphor 16 with light of 445 nm using a spectrophotometer (Otsuka Electronics MCPD-7000). The excitation spectrum was obtained by monitoring the peak wavelength of the emission spectrum.

As can be seen from FIG. 8, the emission spectrum of the red phosphor 16 according to Production Example 16 had a good wavelength matching with the red color filter 126r illustrated in FIG. 11. An analysis of the emission spectrum in FIG. 8 revealed that the peak wavelength and width at half maximum of the emission spectrum of the red phosphor 16 according to Production Example R1 were 630 nm and 8 nm, respectively. The chromaticity coordinates (CIEx, CIEy) on the CIE 1931 color diagram calculated from this emission spectrum were (0.691, 0.307).

Examples and Comparative Examples of Light-Emitting Devices

The following describes some light-emitting devices 10a and a comparative example using FIGS. 9A to 9E and 10.

FIG. 9A is a graphical representation of the emission spectrum of a light-emitting device according to Comparative Example DW0. FIGS. 9B to 9E are graphical representations of the emission spectra of light-emitting devices 10a according to Examples DW1 to DW4. In the graphs in FIGS. 9A to 9E, the vertical axis represents luminous intensity (arbitrary unit), and the horizontal axis represents wavelength (nm). The emission spectra in Examples DW5 and DW6 were identical to that in Example DW1. FIG. 10 is a table that summarizes the ratio between red and green phosphors dispersed in dispersing material (resin), the ratio between the dispersing material and the red and green phosphors, and measurement results for the light-emitting devices according to Comparative Example DW0 and Examples DW1 to DW6. The specific measurement results summarized in FIG. 10 are (1) the (relative) luminous flux of the light emitted by the device, with that of the light emitted by the light-emitting device 10a according to Example DW3 taken as 100, (2) the mass-production suitability of the light-emitting device, and (3) the chromaticity coordinates of the white point of the light emitted by the device through a liquid crystal panel (corresponding to the liquid crystal display portion 120).

Comparative Example DW0

A production example (Comparative Example DW0) of a light-emitting device for comparison with light-emitting devices 10a according to this embodiment is first described with reference to FIGS. 9A and 10.

The light-emitting device according to Comparative Example DW0 was structurally equivalent to the light-emitting devices 10a, which had the structure illustrated in FIG. 7. In the light-emitting device according to Comparative Example DW0, the light-emitting element was a blue LED with a peak emission wavelength of 445 nm (Cree). The green phosphor was the $Mn^{2+}$-activated γ-AlON phosphor obtained in Comparative Production Example P0, and the dispersing material 13 was silicone resin (Shin-Etsu Chemical KER-2500). The red phosphor 16 was the $Mn^{4+}$-activated $K_2SiF_6$ phosphor obtained in Production Example R1.

First, the $Mn^{4+}$-activated $K_2SiF_6$ phosphor of Production Example R1 and the $Mn^{2+}$-activated γ-AlON phosphor of Comparative Production Example P0 were mixed in a weight ratio of 1:19.9 to give a phosphor blend to be dispersed in the silicone resin.

This phosphor blend was dispersed in the silicone resin to give a phosphor-dispersed resin. Specifically, this phosphor-dispersed resin was obtained by mixing the silicone resin and the phosphor blend in a weight ratio of 1:1.42. The phosphor-dispersed resin then proceeded to manual application as in Comparative Example DG0. In this way, a light-emitting device was obtained.

The emission spectrum of the resulting light-emitting device measured with a driving current of 20 mA using a spectrophotometer (Otsuka Electronics MCPD-7000) was as illustrated in FIG. 9A. In Comparative Example DW0, the amounts of dispersed $Mn^{4+}$-activated $K_2SiF_6$ and $Mn^{2+}$-activated γ-AlON phosphors were adjusted so that the white chromaticity point of a light having the emission spectrum of FIG. 9A transmitted through a liquid crystal panel would represent a white of a color temperature of 10,000 K, a color whose chromaticity coordinates (CIEx, CIEy) are near (0.281, 0.288). As presented in FIG. 10, the chromaticity coordinates (CIEx, CIEy) of the white point of the light emitted by the light-emitting device according to Comparative Example DW0 was (0.280, 0.288).

Examples DW1 to DW6

The following describes some production examples of light-emitting devices 10a according to this embodiment (Examples DW1 to DW6) with reference to FIGS. 9B to 9E and 10.

The light-emitting devices 10a according to Examples DW1 to DW6 had the structure illustrated in FIG. 7. In the light-emitting devices 10a according to Examples DW1 to DW6, the light-emitting element 11 was a blue LED with a peak emission wavelength of 445 nm. The green phosphor 12 was the $Mn^{2+}$-activated γ-AlON phosphor obtained in Production Examples P1 to P6, and the dispersing material 13 was silicon resin (Shin-Etsu Chemical KER-2500). The red phosphor 16 was the $Mn^{4+}$-activated $K_2SiF_6$ phosphor obtained in Production Example R1.

As in Comparative Example DW0, the $Mn^{4+}$-activated $K_2SiF_6$ phosphor of Production Example R1 and the $Mn^{2+}$-activated γ-AlON phosphor of Production Examples P1 to P6 were mixed in the weight ratio specified in FIG. 10 to give a phosphor blend to be dispersed in the silicone resin.

The ratio in FIG. 10 is a ratio by weight of the green phosphor 12 to the red phosphor 16. For instance, Example DW1 used a blend of the $Mn^{4+}$-activated $K_2SiF_6$ phosphor according to Production Example R1 and the $Mn^{2+}$-activated γ-AlON phosphor according to Production Example P1 mixed in a weight ratio of 1:16.0.

This phosphor blend was dispersed in the silicone resin to give a phosphor-dispersed resin. Specifically, this phosphor-dispersed resin was obtained by mixing the phosphor blend and the silicone resin in the weight ratio given in FIG. 10.

The ratio in FIG. 10 is a ratio by weight of the combined green phosphor 12 and red phosphor 16 to the silicone resin (dispersing material 13). For instance, Example DW1 used a blend of the silicone resin and the $Mn^{4+}$-activated $K_2SiF_6$ and $Mn^{2+}$-activated γ-AlON phosphors according to Production Example R1 and Production Example P1, respectively, mixed in a weight ratio of 1:0.94. The phosphor-dispersed resin then proceeded to manual application as in Comparative Example DG0. In this way, a light-emitting device was obtained.

The emission spectra of the resulting light-emitting devices measured with a driving current of 20 mA using a spectrophotometer (Otsuka Electronics MCPD-7000) were as illustrated in FIGS. 9B to 9E. As mentioned above, the emission spectra in Examples DW5 and DW6 were identical to that in Example DW1. Similar to those in Comparative Example DW0, the amounts of dispersed $Mn^{4+}$-activated $K_2SiF_6$ and $Mn^{2+}$-activated γ-AlON phosphors in Examples DW1 to DW6 were adjusted so that the white chromaticity point of a light having the emission spectrum of FIGS. 9B to 9E transmitted through a liquid crystal panel would represent a white of a color temperature of 10,000 K, a color whose chromaticity coordinates (CIEx, CIEy) are near (0.281, 0.288), as summarized in FIG. 10.

Evaluation of Light-Emitting Devices

The luminous flux (brightness) of lights emitted by these white-light-emitting devices and the mass-production suitability of these devices are compared with reference to FIG. 10. As illustrated in FIG. 10, the light-emitting devices 10a according to Examples DW1 to DW6 also satisfied the condition that 0.5<(combined weight of green phosphor 12 and red phosphor 16)/(weight of dispersing material 13)≤1.2. The in-crystal Mn concentrations in the green phosphors 12 used in Examples DW1 to DW6 (Production Examples P1 to P6) were controlled not to exceed 2.5 wt %, as summarized in FIG. 3. In these cases, as can be seen from FIG. 10, the light-emitting devices 10a were of superior mass-production suitability.

Similar to light-emitting devices 10 in Embodiment 1, the light-emitting devices 10a illustrated in Examples DW1, DW2, and DW6 satisfied the condition that (combined weight of green phosphor 12 and red phosphor 16)/(weight of dispersing material 13)≤1.0, and these light-emitting devices 10a were of particularly high mass-production suitability. Even when the ratio by weight of the combined green phosphor 12 and red phosphor 16 to the dispersing material 13 exceeded 1.0, the mass-production suitability of the light-emitting device 10a remained as high as in Examples DW1, DW2, and DW6 inasmuch as the weight ratio was close to 1.0, as in Example DW3.

As in Embodiment 1, making the ratio by weight of the phosphors overall including the green phosphor 12 to the dispersing material 13 1.2 or less, preferably 1.0 or less, will improve the yield in the production of, and accordingly the mass-production suitability of, the light-emitting device 10a. Likewise, making the ratio by weight of the phosphors overall including the green phosphor 12 to the dispersing material 13 more than 0.5 will ensure that the chromaticity point of the white light emitted by the light-emitting device 10a is in a suitable region for use as a display device according to the disclosure.

When these light-emitting devices were compared with regard to luminous flux, the light-emitting devices 10a according to Examples DW1, DW2, and DW5 exhibited higher luminous flux than the device according to Comparative Example DW0, as indicated in FIG. 10. That is, the light-emitting devices 10a according to Examples DW1, DW2, and DW5 had higher luminous efficiency than the device according to Comparative Example DW0. As in Embodiment 1, this result is attributable to the good wavelength matching of the emission spectrum of the $Mn^{2+}$-activated γ-AlON phosphor with the luminosity function (see FIG. 6) in the light-emitting devices 10a according to Examples DW1, DW2, and DW5 as compared with the device according to Comparative Example DW0.

As mentioned in Embodiment 1, the in-crystal Mn concentration in the light-emitting device 10 according to Comparative Example DW0 was 2.4 wt % (less than 2.5 wt %). Light-emitting devices according to Comparative Example DW0 may thus need large amounts of $Mn^{2+}$-activated γ-AlON phosphor, and harvesting light from such devices can possibly be inefficient. Thus in this respect, too, at least light-emitting devices 10a according to Examples DW1, DW2, and DW5 are superior to devices according to Comparative Example DW0 in terms of luminous efficiency when the upper limit of the in-crystal Mn concentration, the ratio by weight of the combined green phosphor 12 and red phosphor 16 to the dispersing material 13, and the average particle diameter of the $Mn^{2+}$-activated γ-AlON phosphor are properly controlled as described hereinafter.

When making a comparison between, for example, the light-emitting device according to Comparative Example DW0 and the light-emitting devices 10a according to Examples DW1 and DW2, one may consider controlling the combined amount of the green and red phosphors so as to satisfy the condition that, for example, (combined weight of green and red phosphors)/(weight of dispersing material) <0.5. As mentioned in Embodiment 1, control to meet the condition that (combined weight of green and red phosphors)/(weight of dispersing material)<0.5 may be unnecessary for the practical use of display devices; this would make the chromaticity point of the light emitted by the display device greatly deviate from the intended white point.

The luminous flux of the light emitted by the light-emitting device 10a according to Example DW3 in FIG. 10 was high enough that the device would exhibit an intended possible luminous efficiency for use in display devices according to the disclosure. The light emitted by the light-emitting device according to Example DW4 had a lower luminous flux than that emitted by the light-emitting device 10a according to Example DW3, demonstrating that the device failed to achieve an intended possible luminous efficiency for use in display devices according to the disclosure. As presented in FIG. 3, the in-crystal Mn concentration in Example DW3 was 4.56 wt %, and that in Example DW4 was 4.7 wt %. Light-emitting devices 10a that combine superior mass-production suitability and an intended possible luminous efficiency for use in display devices according to the disclosure can therefore be made possible by making the in-crystal Mn concentration 4.6 wt % or less.

The light-emitting device 10a according to Example DW4 was, however, superior at least in mass-production suitability and therefore has the potential to retain a luminous efficiency sufficient for use in display devices different from those according to the disclosure or illumination devices.

The light-emitting device 10a according to Example DW6 had, as presented in FIG. 3, the same in-crystal Mn concentration as that according to Example DW1. The luminous efficiency was, however, lower in the light-emitting device 10a according to Example DW6 than in that according to Example DW1, as can be seen from FIG. 10. This result appears to be attributable to excessive light scattering caused by the relatively small average particle diameter of the green phosphor 12 in Example DW6, 7.6 μm (see FIG. 3). The light-emitting device 10a according to Example DW6 was, however, superior at least in mass-production suitability and therefore has the potential to retain a luminous efficiency sufficient for use in display devices different from those according to the disclosure or illumination devices.

Embodiment 3

Embodiment 3 can be described with reference to FIGS. 11A to 13 as follows. This embodiment deals with a display device 100 that incorporates light-emitting devices 10a according to Embodiment 2. For the sake of simplicity, this section designates any component that has the same function as one in the previous embodiments with the same reference numeral as that one instead of repeating its details.

The light-emitting devices 10a used in the display device 100 according to this embodiment may be replaced with light-emitting devices 10 according to Embodiment 1. In such a case, the red color filter 126r is optional.

Display Device 100

Figure 12:
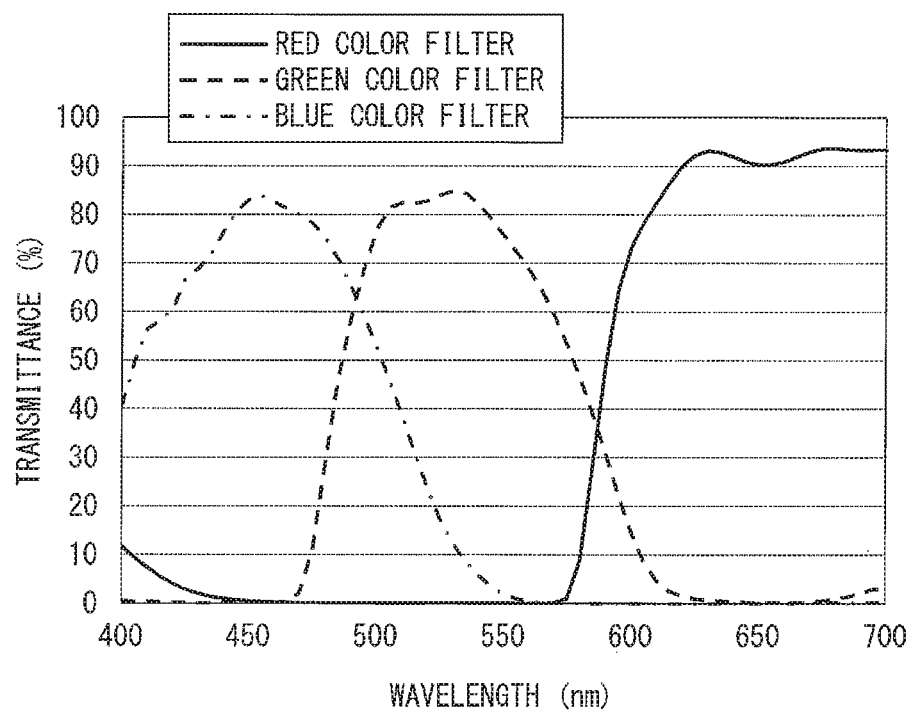
FIG. 12 is a graphical representation of the transmission spectra of a set of color filters.

FIG. 11A is an exploded perspective view of a display device 100 as an example of a display device according to this embodiment. FIG. 11B is an exploded perspective view of a liquid crystal display unit 120a used in the display device 100 illustrated in FIG. 11A. FIG. 12 is a graphical representation of the transmission spectra of a set of color filters used in the display device 100.

As illustrated in FIG. 11A, the display device 100 includes light-emitting devices 10a, a light guide plate 110, and a liquid crystal display portion 120. The light guide plate 110 is transparent or semitransparent. The liquid crystal display portion 120 displays an image and includes multiple liquid crystal display units 120a.

The display device 100 also includes multiple light-emitting devices 10a that face the surface of the light guide plate 110 opposite the surface facing the liquid crystal display portion 120. In this embodiment, as illustrated in FIG. 11A, multiple light-emitting devices 10a are arranged in a matrix. Adjoining the light guide plate 110, a liquid crystal display portion 120 is composed of multiple liquid crystal display units 120a. The light 130 emitted by the light-emitting devices 10a is scattered in the light guide plate 110 so that scattered light 140 shines over the entire area of the liquid crystal display portion 120.

Liquid Crystal Display Units 120a

As illustrated in FIG. 11B, a liquid crystal display unit 120a as a component of the liquid crystal display portion 120 includes a polarizer 121, a transparent conductive layer 123a (with thin-film transistors 122 therein), an oriented film 124a, a liquid crystal layer 125, an oriented film 124b, an upper thin-film electrode 123b, a color filter 126 for displaying color pixels, and an upper polarizer 127 stacked in order.

The color filter 126 has segments that correspond in size to pixels in the transparent conductive layer 123a. The color filter 126 includes a red color filter 126r that transmits red light, a green filter 126g that transmits green light, and a blue color filter 126b that transmits blue light.

A display device 100 according to this embodiment may have filters that separately transmit red, green, and blue lights as in the color filter 126 illustrated in FIG. 11B. An exemplary representation of possible transmission spectra of the respective color filters in such a case is provided in FIG. 12. The Examples below also used a set of color filters having the transmission spectra illustrated in FIG. 12.

The green color filter 126g in this embodiment has a higher transmittance than green color filters commonly used in wide color gamut liquid crystal displays. More specifically, the green color filter 126g transmits at least 80% of light in the wavelength range between 520 nm and 540 nm.

In general, liquid crystal displays may be weak in reproducing the green when with such high-transmittance green color filters. The light-emitting devices 10a used in the display device 100 according to this embodiment incorporate an above-described $Mn^{2+}$-activated γ-AlON green phosphor 12, ensuring a wide color gamut of the display device 100 even when the green color filter 126g is such a high-transmittance one. Giving the green color filter 126g a high transmittance leads to an improvement in the luminance of the display device 100. The display device 100 therefore combines the brightness of displayed images and a wide color gamut.

Examples of Display Devices

The following describes some examples of display devices 100 using FIG. 13. FIG. 13 is a table that summarizes the coverages, percent areas, and chromaticity coordinates of display devices 100 according to Examples DIS1 to DIS3 for this embodiment.

Example DIS1

The display device according to Example DIS1 was a display device 100, which had the structure illustrated in FIGS. 11A and 11B. In the display device 100 according to Example DIS1, the backlight was provided by light-emitting devices 10a according to Example DW1. The color filters used in the display device 100 according to Example DIS1 were those having the transmittances illustrated in FIG. 12, i.e., color filters 126 each having red, green, blue color filters 126r, 126g, and 126b.

Examples DIS2 and DIS3

The display devices according to Examples DIS2 and DIS3 were display devices 100, which had the structure illustrated in FIGS. 11A and 11B. In the display devices 100 according to Examples DIS2 and DIS3, the backlight was provided by light-emitting devices 10a according to Examples DW2 and DW3, respectively. The color filters were color filters 126, which had the transmittances illustrated in FIG. 12.

Evaluation of Display Devices

As summarized in FIG. 13, the display devices 100 according to Examples DIS1 to DIS3 had a high percent area and a high coverage in the NTSC and Adobe RGB color spaces. In particular, the display devices 100 according to Examples DIS1 and DIS2 had suitable color gamuts for use as wide color gamut displays, as demonstrated by NTSC coverages exceeding 90% and Adobe RGB coverages exceeding 95%.

As can be seen from this, the light-emitting device 10a can also provide a display device 100 of high color reproduction as well as offering good mass-production suitability and/or luminous efficiency.

Embodiment 4

Embodiment 4 can be described with reference to FIG. 14 as follows. A light-emitting device 10a according to this embodiment is a variation on a light-emitting device 10a according to Embodiment 2. This section does not describe the specific components in detail excluding the light-emitting element 11 since they are the same as those of a light-emitting device 10a according to Embodiment 2.

FIG. 14 is a table that summarizes the ratio between a green phosphor 12 and a red phosphor 16, the ratio between dispersing material 13 and the combined green phosphor 12 and red phosphor 16, and a measured luminous flux (relative value) of emitted light for some light-emitting devices.

As can be seen from FIG. 14, the light-emitting device 10a according to Embodiment 2 uses a light-emitting element 11 that emits excitation light with a peak wavelength of 445 nm, whereas the light-emitting device 10a according to this embodiment uses one that emits light with a peak wavelength of 460 nm.

These two light-emitting devices 10a use the green phosphor 12 produced in Production Example P1 and contain the green phosphor 12 and a red phosphor 16 dispersed in dispersing material 13 in the proportions given in FIG. 14. In FIG. 14, the light-emitting device 10a according to Embodiment 2 is Example DW1, and that according to Embodiment 4 is termed Example DW7. The amounts of the green phosphor 12, red phosphor 16, and dispersing material 13 (resin) mixed in the light-emitting element 10a according to Example DW7 were adjusted so that the white chromaticity point of the light emitted by the light-emitting device 10a and transmitted through a liquid crystal panel would represent a white of a color temperature of 10,000 K, a color whose chromaticity coordinates (CIEx, CIEy) are near (0.281, 0.288).

As can be seen from FIGS. 10 and 14, the light-emitting device 10a according to Embodiment 4 (Example DW7) was inferior to that according to Example DW1 but superior to that according to Example DW3 in terms of luminous efficiency. This means that even light-emitting devices that use excitation light with a peak wavelength of 460 nm, like the light-emitting device 10a according to Example DW7, can achieve a luminous efficiency sufficient for use in display devices according to the disclosure. That is, even a light-emitting device 10a having a light-emitting element 11 that emits excitation light with a peak wavelength of 460 nm can be improved in terms of mass-production suitability and luminous efficiency.

The light-emitting device 10a according to Example DW1 was superior to that according to Example DW7 in terms of luminous efficiency. The ratio by weight of the combined green phosphor 12 and red phosphor 16 to the dispersing material 13 was lower in the light-emitting device 10a according to Example DW1 than in that according to Example DW7. In other words, Example DW1 used the green phosphor 12 and the red phosphor 16 in smaller quantities than Example DW7. Given the consequent reduced loss of the fluidity of the dispersing material 13, light-emitting devices 10a according to Example DW1 are of even higher mass-production suitability than those according to Example DW7. These results are attributable to the good wavelength matching between (i) the peak wavelength of the excitation light and (ii) the excitation spectra of the green phosphor 12 and the red phosphor 16 and the transmission spectrum of the blue color filter.

Embodiment 5

Embodiment 5 can be described with reference to FIG. 14, in the same way as Embodiment 4, as follows. A light-emitting device 10a according to this embodiment is a variation on light-emitting devices 10a according to Embodiments 2 and 4. This section does not describe the specific components in detail excluding the light-emitting element 11 since they are the same as those of a light-emitting device 10a according to Embodiment 2.

As can be seen from FIG. 14, the light-emitting element 11 in this embodiment emits excitation light with a peak wavelength of 440 nm. The device uses the green phosphor 12 produced in Production Example P1 and contains the green phosphor 12 and a red phosphor 16 dispersed in dispersing material 13 in the proportions given in FIG. 14. In FIG. 14, the light-emitting device 10a according to Embodiment 5 is termed Example DW8. The amounts of the green phosphor 12, red phosphor 16, and dispersing material 13 (resin) mixed in the light-emitting device 10a according to Example DW8 were adjusted in the same way as in Embodiment 4.

As can be seen from FIGS. 10 and 14, the light-emitting device 10a according to this embodiment (Example DW8) is superior to that according to Example DW3 in terms of luminous efficiency. This means that even light-emitting devices that use excitation light with a peak wavelength of 440 nm, like the light-emitting device 10a according to Example DW8, can achieve a luminous efficiency sufficient for use in display devices according to the disclosure. That is, even a light-emitting device 10a having a light-emitting element 11 that emits excitation light with a peak wavelength of 440 nm can be improved in terms of mass-production suitability and luminous efficiency.

Light-emitting devices 10a according to Example DW1 are superior to those according to Example DW8 in terms of luminous efficiency and mass-production suitability, for the same reason as stated in the comparison between Examples DW1 and DW7.

Recap

A light-emitting device (10, 10a) according to a first aspect of the disclosure includes a light-emitting element (11) that emits blue light, a $Mn^{2+}$-activated γ-AlON phosphor that is excited by the blue light and emits green light (a green phosphor 12), and a dispersing material (13) in which the $Mn^{2+}$-activate γ-AlON phosphor is dispersed. The $Mn^{2+}$-activated γ-AlON phosphor has an in-crystal Mn concentration of 2.5 wt % or more, and the shortest path of the blue light through the dispersing material is 1 mm long or shorter.

In this configuration, the light-emitting device according to an aspect of the disclosure is a small-sized one whose shortest optical pass is 1 mm or shorter. In addition to this, the light-emitting device according to an aspect of the disclosure uses a $Mn^2$-activated γ-AlON phosphor that is excited by blue light and emits green light.

In general, when a $Mn^{2+}$-activated γ-AlON phosphor, relatively inefficient in absorbing excitation light, is used in a small-sized light-emitting device, increasing the amount of the phosphor to an excessive extent to improve the luminous efficiency of the device may affect the fluidity of the dispersing material. As mentioned above, the reduced fluidity can lead to a reduced yield in the production of the device by causing variations in the color of emitted light, which in turn can make the device difficult to mass-produce with consistent quality.

After extensive research, the inventors found that making the in-crystal Mn concentration in the $Mn^{2+}$-activated γ-AlON phosphor 2.5 wt % or more limits the loss of the fluidity of the dispersing material.

Despite its shortest optical path measuring 1 mm or shorter, this light-emitting device according to an aspect of the disclosure can be made with a smaller amount of $Mn^{2+}$-activated γ-AlON phosphor by virtue of the high in-crystal Mn concentration, 2.5 wt % or more. The loss of the fluidity of the dispersing material that would occur with increasing amount of the phosphor is therefore limited. The aforementioned variations in color are less frequent, which leads to an improvement in the yield in the production of the device. Such a device is no longer very difficult to mass-produce with consistent quality.

In a second aspect of the disclosure, a light-emitting device may be configured such that, in the first aspect, 0.5<(weight of the $Mn^{2+}$-activated γ-AlON phosphor)/(weight of the dispersing material)≤1.2.

In such a configuration, the ratio by weight between the $Mn^{2+}$-activated γ-AlON phosphor and the dispersing material (weight ratio) is controlled to exceed 0.5. This controls the chromaticity point of the light emitted by the light-emitting device to a suitable range, in which the light-emitting device can be used in a display device according to the disclosure.

The weight ratio is also controlled to be 1.2 or less. In such a case the relative amount of the $Mn^{2+}$-activated γ-AlON phosphor to the dispersing material cannot be too large, and the loss of the fluidity of the dispersing material is limited.

In a third aspect of the disclosure, a light-emitting device may be configured such that, in the first or second aspect, the $Mn^{2+}$-activated γ-AlON phosphor has an average particle diameter of 40 μm or less.

An average particle diameter exceeding 40 μm may affect the fluidity of the dispersing material. In the light-emitting device according to an aspect of the disclosure, however, the average particle diameter may be 40 μm or less. This would limit the loss of the fluidity of the dispersing material.

In a fourth aspect of the disclosure, a light-emitting device may be configured such that, in one of the first to third aspects, the in-crystal Mn concentration in the $Mn^{2+}$-activated γ-AlON phosphor is 4.6 wt % or less.

When the in-crystal Mn concentration exceeds 4.6 wt %, the luminous efficiency of the light-emitting device may be so low that the device cannot achieve a sufficient luminous efficiency when used in a display device according to the disclosure. In the light-emitting device according to an aspect of the disclosure, the in-crystal Mn concentration may be 4.6 wt % or less. In such a case the luminous efficiency of the device is high enough that it achieves a sufficient luminous efficiency when used in a display device according to the disclosure.

In a fifth aspect of the disclosure, a light-emitting device may be configured such that, in one of the first to fourth aspects, the blue light has a peak wavelength of 440 nm or more and 460 nm or less.

Such a configuration makes the excitation of the $Mn^{2+}$-activated γ-AlON phosphor more efficient and offers a good wavelength matching with a blue color filter that transmits blue light, thereby improving the luminous efficiency of the light-emitting device and the luminance (brightness of displayed images) of a display device that incorporates the light-emitting device.

In a sixth aspect of the disclosure, a light-emitting device may be configured such that, in one of the first to fifth aspects, the blue light has a peak wavelength of 440 nm or more and 450 nm or less.

Such a configuration leads to an even more efficient excitation of the $Mn^{2+}$-activated γ-AlON phosphor than in the light-emitting device according to the fifth aspect, thereby further improving the luminous efficiency of the light-emitting device.

In a seventh aspect of the disclosure, a light-emitting device may be configured such that, in one of the first to sixth aspects, the $Mn^{2+}$-activated γ-AlON phosphor contains Mg.

In such a configuration, the Mg in the $Mn^{2+}$-activated γ-AlON phosphor helps the phosphor taking in Mn by stabilizing the crystallographic structure of the γ-AlON crystals. This helps increase the concentration of Mn in the phosphor, thereby improving the luminous efficiency of the light-emitting device according to an aspect of the disclosure.

In an eighth aspect of the disclosure, a light-emitting device (10a) may further include, in one of the first to seventh aspects, a red phosphor (16) that is excited by the blue light and emits red light.

Such a configuration allows the light-emitting device according an aspect of the disclosure to emit white light by blending blue light from the light-emitting element, green light from the $Mn^{2+}$-activated γ-AlON phosphor, and red light from the red phosphor.

In a ninth aspect of the disclosure, a light-emitting device may be configured such that, in the eighth aspect, the red phosphor is a $Mn^{4+}$-activated fluoride complex phosphor.

Such a configuration improves the luminous efficiency of the light-emitting device according to an aspect of the disclosure with a narrow width at half maximum of the emission spectrum of the red light emitted by the $Mn^{4+}$-activated fluoride complex phosphor and high response of the phosphor to the excitation with blue light.

In a tenth aspect of the disclosure, a light-emitting device may be configured such that, in the ninth aspect, the $Mn^{4+}$-activated fluoride complex phosphor is $K_2(Ti_{1-h}Mn_h)F_6$ or $K_2(Si_{1-h}Mn_h)F_6$ with h being 0.001 or more and 0.1 or less.

According to such a configuration, when the $Mn^{4+}$-activated fluoride complex phosphor is $K_2(Ti_{1-h}Mn_h)F_6$ or $K_2(Si_{1-h}Mn_h)F_6$ with h being 0.001 or more and 0.1 or less, improves the luminous efficiency and reliability of the light-emitting device according to an aspect of the disclosure with high luminous intensity of the phosphor and high stability of phosphor crystals.

In an eleventh aspect of the disclosure, a light-emitting device may be configured such that, in the ninth or tenth aspect, the $Mn^{4+}$-activated fluoride complex phosphor is a $Mn^{4+}$-activated $K_2SiF_6$ phosphor.

Such a configuration improves the reliability of the light-emitting device according to an aspect of the disclosure with high stability (waterproofness) of the $Mn^{4+}$-activated $K_2SiF_6$ phosphor.

A display device (100) according to a twelfth aspect of the disclosure may include a light-emitting device according to one of the first to eleventh aspects.

Such a configuration provides a display device with improved luminous efficiency.

Supplemental Notes

The disclosure is not limited to the description of the embodiments above, but may be altered in various ways by a skilled person within the scope of the claims. Any embodiment based on a proper combination of techniques disclosed in different embodiments is also encompassed in the technical scope of the disclosure. Further, combining techniques disclosed in different embodiments can provide a new technical feature.

The present disclosure contains subject matter related to that disclosed in Japanese Priority Patent Application JP 2016-064697 filed in the Japan Patent Office on Mar. 28, 2016, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting device comprising:
   a light-emitting element that emits blue light;
   a $Mn^{2+}$-activated γ-AlON phosphor that is excited by the blue light and emits green light; and
   a dispersing material in which the $Mn^{2+}$-activated γ-AlON phosphor is dispersed, wherein:
   the $Mn^{2+}$-activated γ-AlON phosphor has an in-crystal Mn concentration of 2.5 wt % or more;
   a shortest path of the blue light through the dispersing material is 1 mm long or shorter, and
   0.5<(a weight of the $Mn^{2+}$-activated γ-AlON phosphor)/(a weight of the dispersing material)≤1.2.

2. The light-emitting device according to claim 1, wherein the $Mn^{2+}$-activated γ-AlON phosphor has an average particle diameter of 5 μm or more and 40 μm or less.

3. The light-emitting device according to claim 1, wherein the in-crystal Mn concentration of the $Mn^{2+}$-activated γ-AlON phosphor is 4.6 wt % or less.

4. The light-emitting device according to claim 1, wherein the blue light has a peak wavelength of 440 nm or more and 460 nm or less.

5. The light-emitting device according to claim 1, wherein the blue light has a peak wavelength of 440 nm or more and 450 nm or less.

6. The light-emitting device according to claim 1, wherein the $Mn^{2+}$-activated γ-AlON phosphor contains Mg.

7. The light-emitting device according to claim 1, further comprising a red phosphor that is excited by the blue light and emits red light.

8. The light-emitting device according to claim 7, wherein the red phosphor is a $Mn^{4+}$-activated fluoride complex phosphor.

9. The light-emitting device according to claim 8, wherein the $Mn^{4+}$-activated fluoride complex phosphor is $K_2(Ti_{1-h}Mn_h)F_6$ or $K_2(Si_{1-h}Mn_h)F_6$, where h is 0.001 or more and 0.1 or less.

10. The light-emitting device according to claim 8, wherein the $Mn^{4+}$-activated fluoride complex phosphor is a $Mn^{4+}$-activated $K_2SiF_6$ phosphor.

11. A display device comprising a light-emitting device according to claim 1.

* * * * *